United States Patent [19]

Kagimasa et al.

[11] Patent Number: 5,511,177
[45] Date of Patent: Apr. 23, 1996

[54] FILE DATA MULTIPLEXING METHOD AND DATA PROCESSING SYSTEM

[75] Inventors: Toyohiko Kagimasa, Sagamihara; Yoshifumi Takamoto, Fuchu; Hitoshi Kakuta, Tokyo, all of Japan

[73] Assignee: Hitachi, Ltd., Tokyo, Japan

[21] Appl. No.: 250,427

[22] Filed: May 27, 1994

Related U.S. Application Data

[63] Continuation-in-part of Ser. No. 979,275, Nov. 20, 1992.

[30] Foreign Application Priority Data

Nov. 21, 1991 [JP] Japan .................................. 3-305928
May 27, 1993 [JP] Japan .................................. 5-125773

[51] Int. Cl.⁶ .......................... G06F 12/00; G06F 13/00
[52] U.S. Cl. .................. 395/441; 395/438; 395/182.04; 395/600; 395/497.01; 395/497.02; 364/DIG. 1; 364/243; 364/243.6; 364/268; 364/268.1; 364/268.5
[58] Field of Search ................... 395/438–441, 395/497.01, 497.02, 182.04, 600; 371/10.1, 10.2

[56] References Cited

U.S. PATENT DOCUMENTS

| | | | |
|---|---|---|---|
| 4,542,458 | 9/1985 | Kitajima et al. | 364/DIG. 1 X |
| 5,043,876 | 8/1991 | Terry | 364/DIG. 1 X |
| 5,218,695 | 6/1993 | Noveck et al. | 395/600 |
| 5,390,313 | 2/1995 | Yanai et al. | 395/425 |
| 5,392,244 | 2/1995 | Jacobson et al. | 365/200 |
| 5,432,922 | 7/1995 | Polyzois et al. | 395/425 |

OTHER PUBLICATIONS

Jim Gray, "Disk Shadowing," Proceedings of the 14th VLDB Conference, 1988, pp. 331–338.
"Guide to OSF/1: A Technical Synopsis," published by O'Reilly & Associates, Inc., 1991, pp. 7–1 to 7–10.
"Operating System Concept," 3rd Ed., published by Addison–Wesley Publishing Co., 1991, pp. 507–508.
"The Design of the UNIX Operating System," published by Prentice–Hall, Inc., 1986, pp. 187–223.

*Primary Examiner*—Paul V. Kulik
*Attorney, Agent, or Firm*—Antonelli, Terry, Stout & Kraus

[57] ABSTRACT

In a data processing system to which a large number of disk drive units are connected, data in the whole or part area of a file are multiplexed and distributed into a plurality of disk drive units when the file is opened, and the multiplex data of the file are deleted when the file is closed. Among the multiplex data, data shortest in access time or striped data shortest in transfer time is selected to be accessed. When data multiplexing is applied only to the part area, the data storage capacity of the system can be reduced more remarkably.

24 Claims, 21 Drawing Sheets

FILE DATA MULTIPLEXING METHOD AND DATA PROCESSING SYSTEM

CROSS-REFERENCE TO RELATED APPLICATIONS

This is a Continuation-in-part of application Ser. No. 07/979,275 filed Nov. 20, 1992, the subject matter of which is incorporated herein by reference.

This application is related to U.S. application Ser. No. 08/117,685 filed Sep. 8, 1993 and U.S. application entitled "DISK ARRAY SYSTEM AND ITS CONTROL METHOD" based on Japanese patent application No. 5-125766 filed May 27, 1993, the contents of which are incorporated herein by reference.

BACKGROUND OF THE INVENTION

The present invention relates to an improvement in performance and reliability of a file system, and particularly to a file data multiplexing method adapted for a high-speed file system in a data processing system to which a large number of disk drive units are connected.

A first conventional technique with respect to a conventional file data multiplexing method has been described in Jim Gray, "Disk Shadowing", Proceedings of the 14th VLDB Conference, 1988, pp. 331–338.

The first conventional technique discloses a method in which mirroring is performed by magnetic disk drive units. In basic mirroring, two disk drive units make a pair to hold one and the same data. Although multiplexing using three or more disk drive units is specifically called "shadowing" in the aforementioned literature, such multiplexing using three or more disk drive units is now called "mirroring". The operation of mirroring will be described below. One and the same data is written in one and the same address in each of a plurality of disk drive units to thereby perform multiplexing at the time of writing of data. The data is read from one of the disk drive units at the time of reading the data.

Accordingly, because a plurality of reading operations can be carried out in parallel compared with the case where data is stored in a single disk drive unit, I/O throughput which is the number of I/O processings per unit time is improved. Further, because a disk, drive unit shortest in seek time is selected so that data can be read from the disk drive unit, the I/O time required for "read" can be shortened. The "write" performance as to I/O throughput and I/O time is lowered because of overhead imposed on starting of I/O processings for a plurality of disk drive units and overhead imposed on waiting for completion of writing in the all disk drive units. The average performance is however improved compared with the case of a single disk drive unit even in the case where the number of executed "read" operations is equal to the number of executed "write" operations, because the lowering of the "write" performance is sufficiently small compared with the improvement of the "read" performance.

Another advantage of mirroring is in an improvement both in reliability and in availability. Even in the case where a failure occurs in one disk drive unit, copied data stored in another disk drive unit can be accessed because a plurality of copies of the same data are provided. Accordingly, data is not lost. The designation of mirroring is decided by a system manager and set through a system command given from a console by the system manager. Although the mirroring is, in most cases, realized by a combination of hardware such as a disk controller and software for controlling the disk controller, there is an example in which the mirroring is realized by an operating system (OS).

A second conventional technique with respect to a data multiplexing method in which data multiplexing is performed by magnetic disk areas, is described in "Guide to OSF/1: A Technical Synopsis" (1991), pp. 7-1-7-10, O'Reilly & Associates, Inc.

In the second conventional technique, mirroring is performed not by disk drive units but by disk areas on the basis of the concept "logical volume". One disk is divided into fixed-length areas called "extent", so that one logical extent corresponds to one physical extent or a plurality of physical extents. Any suitable physical disk drive unit may be selected for the physical extent to be related to the logical extent. Further, physical extents of different physical disk drive units may be related to one logical extent. One virtual disk drive unit formed by collection of logical extents is called "logical volume of disk". The case where one logical extent corresponds to one physical extent or a plurality of physical extents is mirroring. The operation of mirroring will be described below. One and the same data is written in the same relative addresses of the extent in a plurality of physical extents corresponding to a logical extent so that data multiplexing is performed at the time of writing of data into logical extents. The data is read from one of the physical extents at the time of reading the data.

Accordingly, partial mirroring of a disk drive unit can be provided by means of "logical volume". The designation of mirroring is decided by a system manager and set through a system command given from a console by the system manager in the same manner as in the first conventional technique. The mirroring using "logical volume" has not only the advantage that improvement in performance, reliability and availability can be attained in the same manner as in the first conventional technique but also another advantage that the disk capacity required for multiplexing can be reduced because only the important area of the disk drive unit can be subjected to multiplexing. In the second conventional technique, mirroring is realized by an OS.

A third conventional technique in which data multiplexing is performed not by magnetic disk drive units but by files is described in "Operating System Concept Third Edition", Addison-Wesley Publishing Company, 1991, pp. 507–508.

A data multiplexing method in which data multiplexing is performed by files in the third conventional technique is called "replication". The replication is used for an improvement in reliability and applicability of a distributed system. A file called "replica" for holding the same data as that of a master file is stored in a magnetic disk drive unit of a data processing system different from a data processing system containing the master file. In the case where a failure occurs in a computer system in which a master file is existent, an access-disabled state can be avoided by accessing the replica. At the time of writing data into files, not only data is written in a master file but also the same data is written in a corresponding replica or a plurality of corresponding replicas, so that data multiplexing is performed. At the time of reading data, the data is read from the master file or an arbitrary replica. Multiple issuing "write" requests to the replicas causes large overhead in the distributed system. Therefore, as a consistency control method for mirroring updating of a master file in a replica, there is a low consistency method in which updated data collected at intervals of a predetermined time are written in a replica, other than the aforementioned, high consistency method in which writing is performed simultaneously with the updating of a master file. The designation of a replica is made through a system command given by a system manager, but a replica provided as a cache in a data processing system requesting access to a file is automatically generated by the OS at the time of access requesting. This is called "cache replication".

SUMMARY OF THE INVENTION

In the first and second conventional techniques, mirroring is static data multiplexing in which a system manager predicts load. Accordingly, file storage devices for storing all files having the possibility that load may become high are multiplexed in advance. There arises a first problem that a large number of storage devices and a large storage capacity are required in the whole system. Assuming now a certain point of time, then use of the all files is rare. Accordingly, storage devices for storing multiplex data of files not used at that point and the storage capacity thereof are quite wasteful. It is preferable that a storage capacity necessary for multiplexing is used as occasion demands.

Data multiplexing for the purpose of an improvement in performance is classified into a plurality of forms, for example, a matched form and a mismatched form, in accordance with the feature in file I/O of a program, that is, in accordance with the I/O characteristic of a program. When, for example, the frequency of "write" is higher than the frequency of "read", it is preferable that data is duplexed in mirroring. When, for example, the frequency of "read" is higher than the frequency of "write", it is preferable that data is triplexed or multiplexed in mirroring. If the quantity of data in one "read" operation is large so that high-speed transfer is required, there is suitable a form called "striping" in which data is divided into fixed-length blocks to be cyclically allocated to a plurality of storage devices. On the other hand, it is general that I/O characteristic varies in accordance with the program issuing an I/O request even in the case where only one file is given. Accordingly, static data multiplexing in these conventional techniques has a second problem that performance is lowered in the case where there current I/O characteristic is different from I/O characteristic assumed at the time of setting thereof.

The replication in the third conventional technique aims at storing multiplex data in different data processing systems to thereby improve reliability but has no consideration of improving I/O performance. There arises a third problem that performance is not improved because the time required for I/O access to a replica existing in a different data processing system is prolonged by overhead imposed on data transfer through a network.

Further, in the replication, all files having a possibility that load may become high are subjected to multiplexing in advance by a center manager in the same manner as in mirroring. Accordingly, the first problem that a large storage capacity is required in the whole system arises also in the replication. In addition, like mirroring, the replication is static data multiplexing. The second problem that there is no consideration of the change of I/O characteristic arises in the replication.

In the cache replication as a modification of the third conventional technique, the first problem does not arise because there is performed dynamic data multiplexing in which a replica as a cache is generated in a data processing system as a request source at the time of requesting access to a file. The replica as a cache is however provided for simple duplexing, so that there is no consideration of I/O characteristic. Accordingly, the second problem arises also in the third conventional technique. Further, in the cache replication, overhead imposed on transfer of an I/O request to a data processing system containing a target file through a network is eliminated to thereby improve access performance. The cache replica, however, cannot be accessed from any data processing system except a data processing system containing the cache replica. There arises a fourth problem that any improvement of I/O performance cannot be attained in the data processing system containing the master file.

An object of the present invention is to provide a file data multiplexing method and a data processing system by which high-performance I/O characteristic is provided in a data processing system to which a plurality of file storage devices are connected through controllers.

Another object of the present invention is to provide a file data multiplexing method and a data processing system by which a file system of a small storage capacity required is provided in a data processing system to which a plurality of file storage devices are connected through controllers.

The foregoing objects of the present invention are achieved by a method comprising the steps of: multiplexing data in at least one part of a file to distribute the data into a plurality of drive units (file storage devices) when a request to open the file is given; and deleting the multiplex data when the file is closed. The foregoing objects of the present invention are also achieved by a method comprising the steps of: multiplexing data in whole or part area of an open file to distribute the data into a plurality of drive units when the frequency of use of the open file is not lower than a predetermined value; and deleting the multiplex data when the file is closed.

DESCRIPTION OF THE PREFERRED EMBODIMENTS

Embodiments of the present invention will be described below.

Referring now to FIGS. 1 through 14, a first embodiment of the present invention will be described. The first embodiment shows the case where a method according to the present invention is carried out by an operating system (OS) in a data processing system to which a plurality of magnetic disk drive devices RE connected through disk controllers. Accordingly, a method according to the present invention is incorporated in a file system of the OS. The file system is premised on that of UNIX which is one of main-current operating systems at present. The file system of UNIX is described in "The Design of The UNIX Operating System", Prentice-Hall, Inc., 1986, pp. 187–223. Because the method according to the present invention is carried out in the structure in which a process is added to the file system of UNIX, the detailed description of the file system having no relation to the present invention will be omitted. That is, a process for the present invention is added to conventional system calling functions, such "open", "read" and "write", of the file system so that an original function is processed by calling a processing routine corresponding to a conventional system call function. Further, some new processing programs are provided. In the first embodiment, a program operated at intervals of a predetermined time makes a decision to multiplex data on the basis of the condition of use of files or file storage devices, that is, makes a decision to generate a mirror file.

Figure 1:
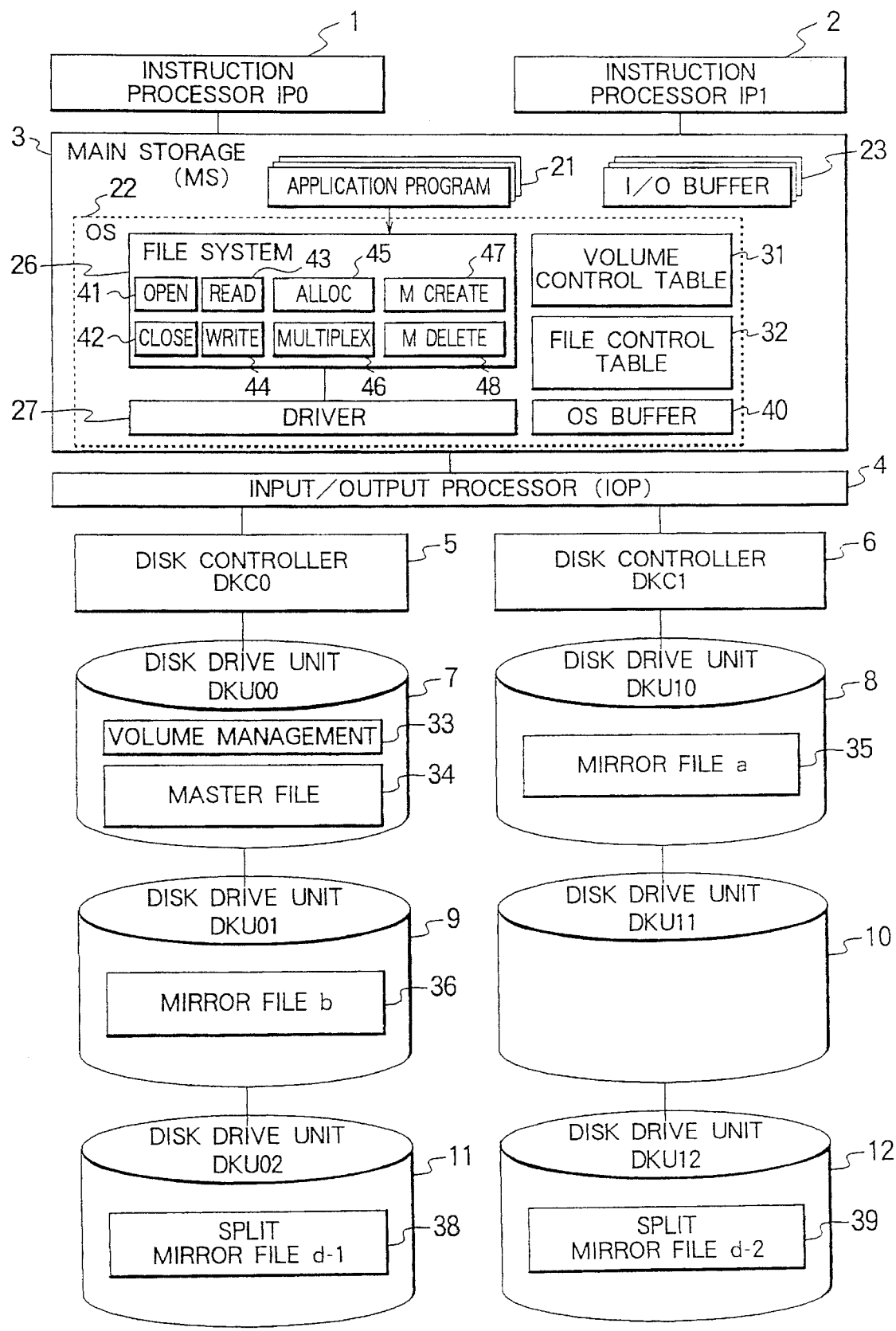
FIG. 1 is a block diagram showing the structure of a data processing system as a first embodiment of the present invention.

The structure of the first embodiment will be described below. FIG. 1 is a block diagram of a data processing system. Referring now to FIG. 1, the hardware structure of the first embodiment will be described. Instruction processors (IPs) 1 and 2 and an I/O processor (IOP) 4 are connected to a main storage (MS) 3. Disk controllers (DKCs) 5 and 6 are connected to the IOP 4. Disk drive units (DKUs) 7, 8, 9, 10, 11 and 12 are connected to the DKCs 5 and 6. One DKU which is a disk drive unit constituted by one spindle, is managed as one volume by an OS 22. Upon reception of an instruction from the IPs 1 and 2 to start an IOP program called "channel program", the IOP 4 executes I/O processing. When the IOP 4 receives completion of I/O processing from an I/O device, the IOP 4 generates I/O interruption to report the completion of I/O processing to the IPs 1 and 2. The DKCs 5 and 6 control the DKUs in response to data write and data read commands given by the IOP 4 and performs magnetic disk I/O processing. The I/O hardware structure of the IOP, DKCs and DKUs is known in the field of main frame computer.

In the following, the software structure of the first embodiment will be described. In a data processing system, there are operated application programs 21 for issuing I/O requests and an OS 22 for processing the I/0 requests. The OS 22 has a program module composed of a file system 26 and a disk driver 27, and a data structure composed of a volume control table 31 and a file control table 32 in the MS 3, a volume management block 33 in the DKU and an OS buffer 40. The file system 26 is a software system for providing the abstract concept and operation of files independent of characteristic of I/O devices.

The OS 22 contains an "open" program 41, a "close" program 42, a "read" program 43, a "write" program 44, an "alloc" program 45, a "multiplex" program 46, a "mirror create" program 47 and a "mirror delete" program 48 for performing file opening, file closing, file reading, file writing, disk block allocating, multiplex determining, mirror file creating and mirror file deleting, respectively. The disk driver 27 is a software device for performing I/O processing below the consciousness of characteristic of disk drive units. The file system 26 calls the disk driver 27 as a lower module to provide an abstract file function. The disk driver 27 has entries of programs corresponding to system calling functions such as "open" and "read" with respect to files, so that I/O processing is performed dependently of the characteristic of magnetic disks.

In this embodiment, a process is added to the aforementioned programs of the file system 26 but there is no change of the driver 27. Accordingly, the description of the procedure in the driver 27 will be omitted. Data contained in files are stored in the DKUs. An original file is called "master file" 34. Multiplex data files having the same content as that of the master file 34 are called "mirror files" 35, 36, 38 and 39.

Figure 2:
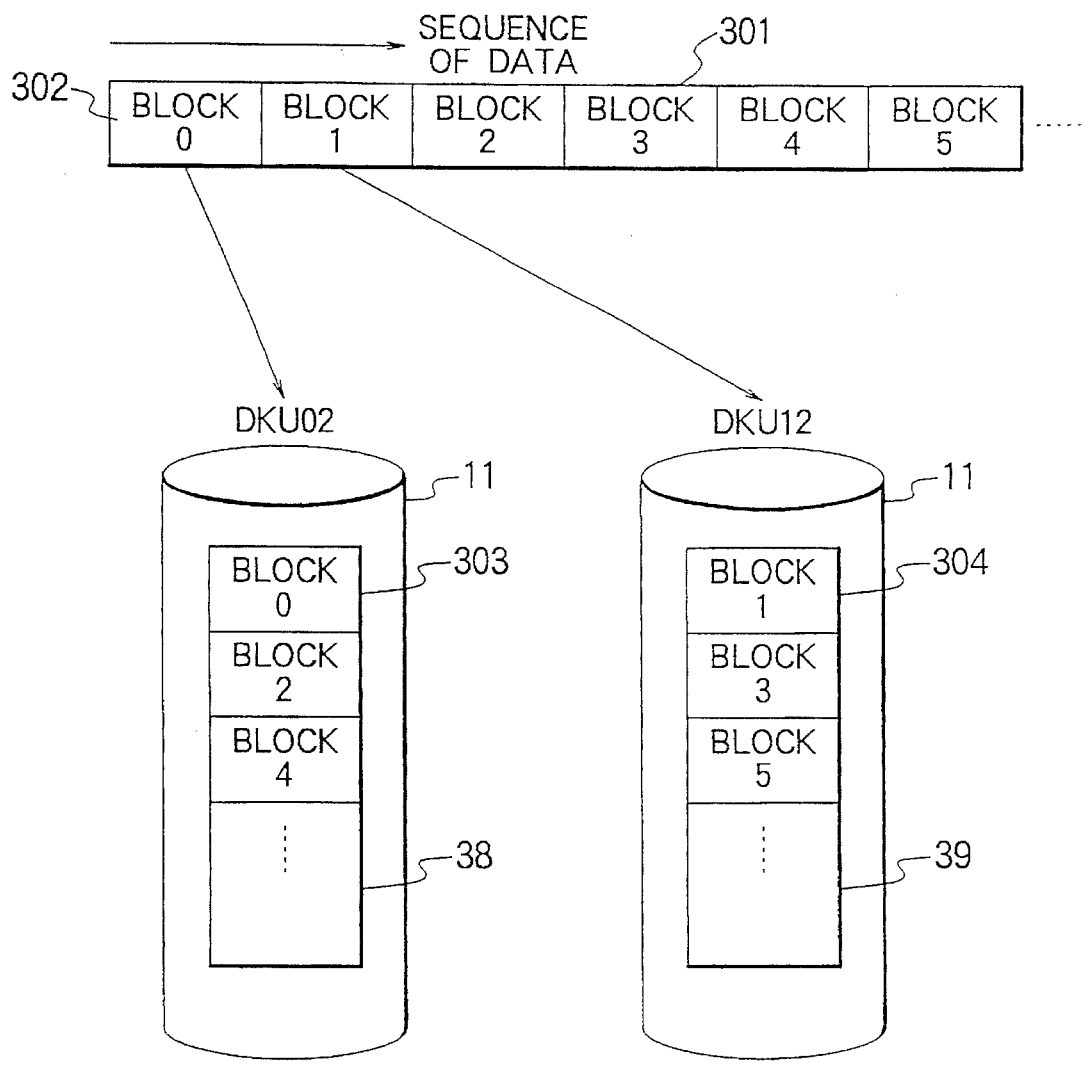
FIG. 2 is a structural diagram of split mirror files in the first embodiment.

As shown in FIG. 2, split mirror files 38 and 39 are so-called striped files in which blocks 302 in file data 301 are alternately allocated to a plurality of disk drive units DKU02 and DKU12. In the case where the length of data to be accessed is large, the disk drive units DKU02 and DKU12 can be operated in parallel so that data transfer speed is improved. When, for example, an application program 21 issues "read" requests for the blocks 0 and 1, the disk drive units DKU02 and DKU12 can perform reading operations in parallel so that the data transfer speed is increased by twice.

Figure 3:
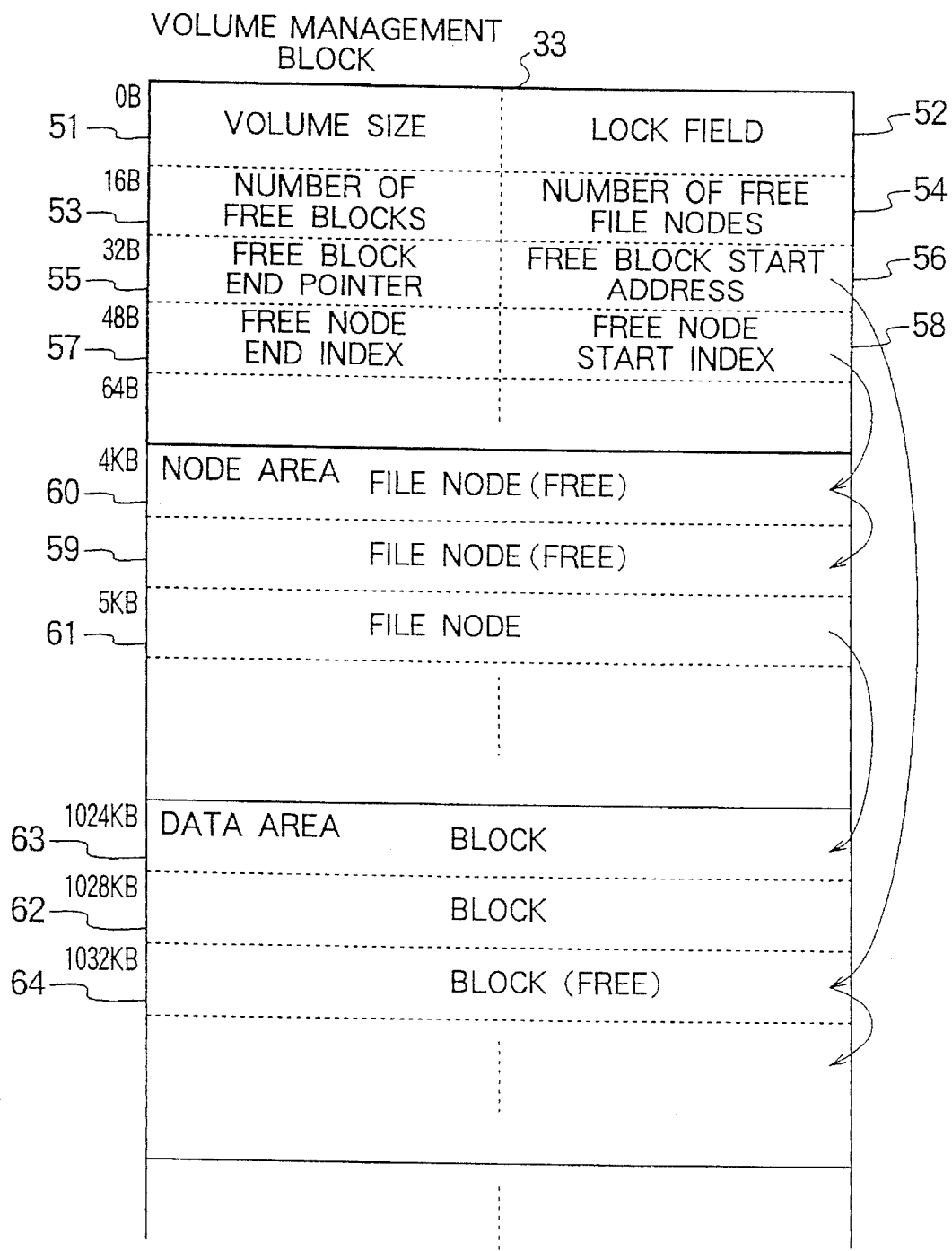
FIG. 3 is a structural diagram of the volume management block in the first embodiment.

FIG. 3 is a structural diagram of the volume management block 33. The OS 22 manages one DKU as a volume. The disk area of the volume is divided into three regions, namely, volume management block 33, file node area 59 and data area 62. The volume management block 33 has the following fields. A free block start address 56 indicates a list of free blocks 64 in the data area. A free node start index 58 indicates a list of free file nodes 60. When the file system 26 creates a file, a free area is retrieved from these lists and used for the file.

Figure 4:
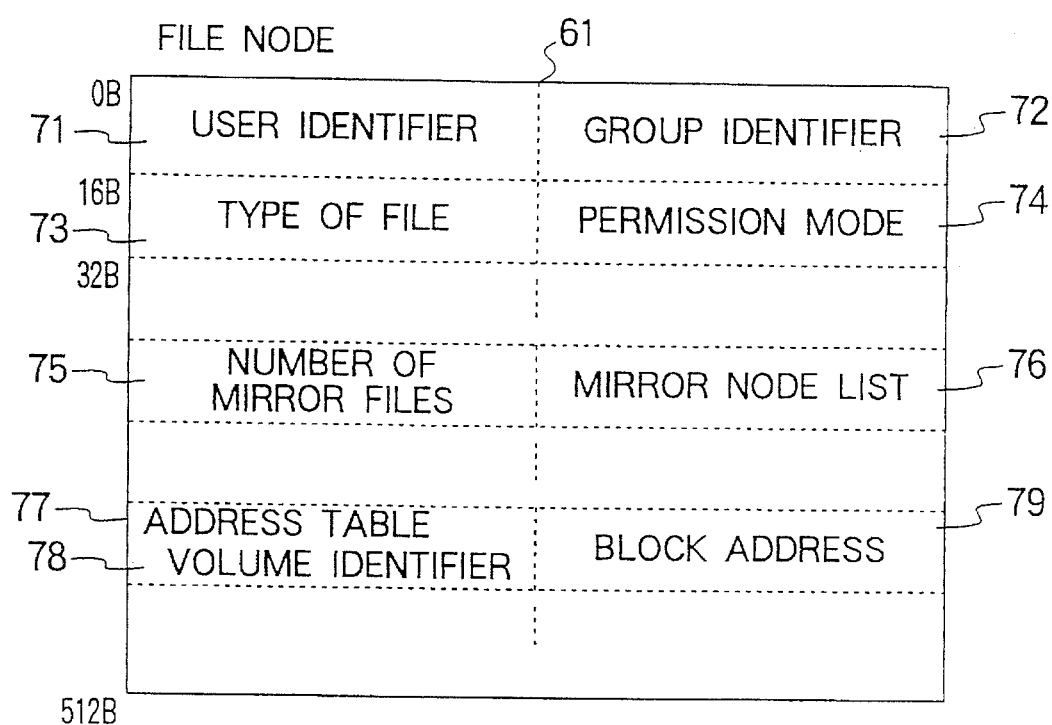
FIG. 4 is a structural diagram of the file node in the first embodiment.

FIG. 4 is a structural diagram of a file node 61. The file node 61 holds information for one file. The following fields are added to fields 71, 72, 73 and 74 for conventional basic information such as user identifier and so on. Although an address table 77 is conventional information for holding addresses 79 of a plurality of blocks 63 allocated for the file, a volume identifier field 78 for identifying the volume of each block 63 is provided for the present invention. A mirror read list 76 indicates a list of mirror file nodes in the case where there is any mirror file.

Figure 5:
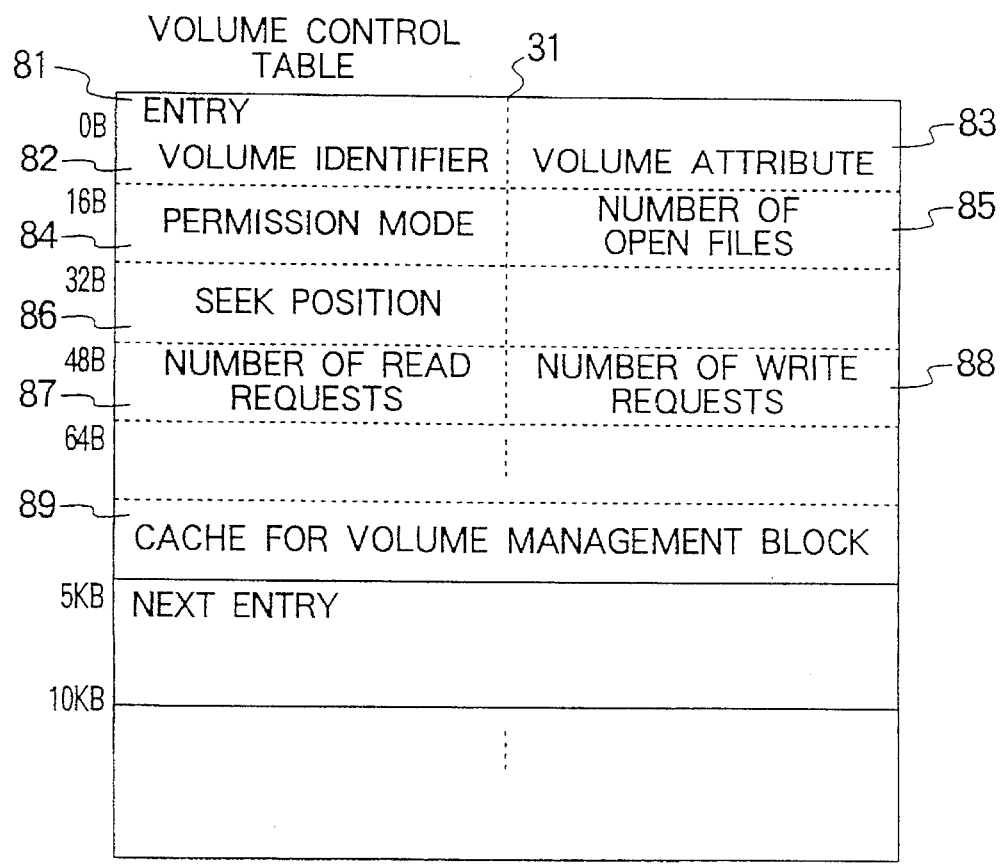
FIG. 5 is a structural diagram of the volume control table in the first embodiment.

FIG. 5 is a structural diagram of the volume control table 31. In the volume control table 31, there are entries 81 corresponding to volumes. One volume entry 81 in the volume control table 31 has the following fields: number of open files 85 for holding the number of open files; seek position 86 for indicating the current head position of the volume; number of read requests 87 for the volume; number of write requests 88 for the volume; and area 89 for using the volume management block 33 as a cache, that is, for making the volume management block 33 resident in the main storage. The number of read requests 87 and the number of write requests 88 are reset by the "multiplex" program 47 at intervals of a predetermined time.

Figure 6:
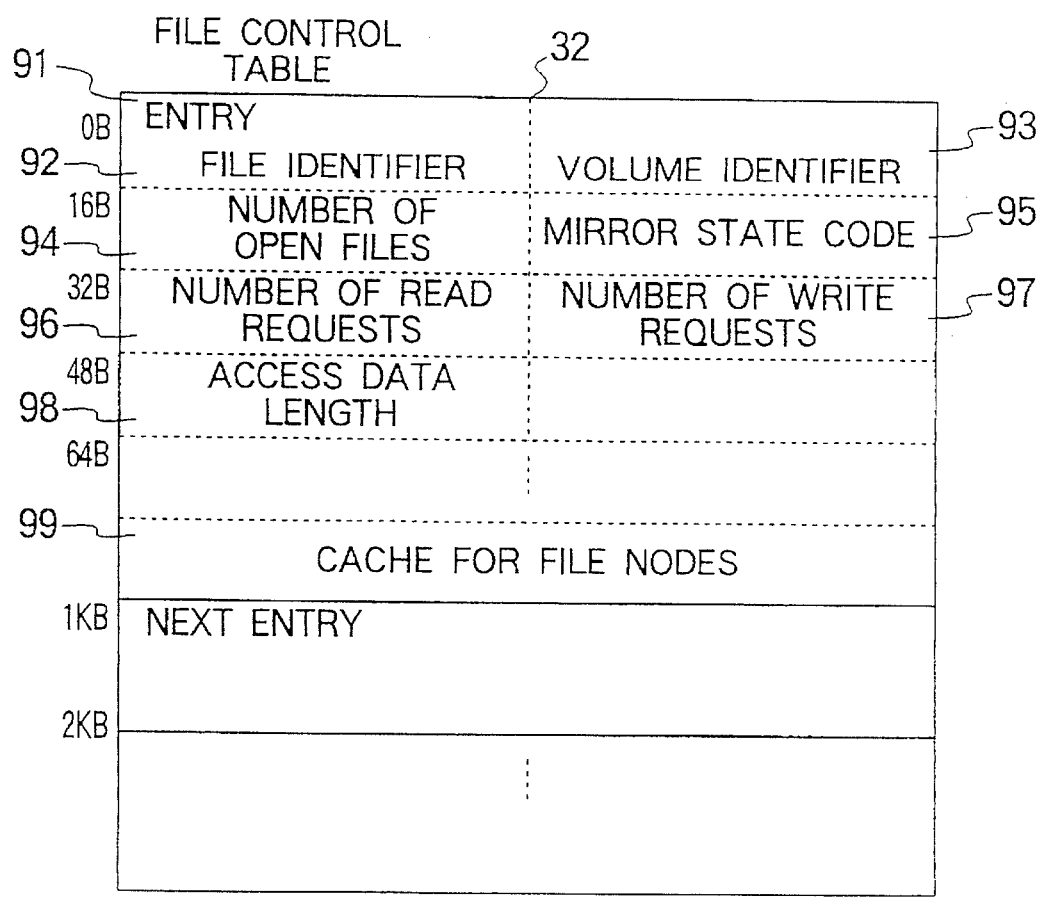
FIG. 6 is a structural diagram of the file control table in the first embodiment.

FIG. 6 is a structural diagram of the file control table 32. The file control table 32 has the following fields: number of open files 94 for indicating the number of open files; mirror state code 95 for indicating the state of the file with respect to a mirror; number of read requests 96 for the file; number of write requests 97 for the file; access data length 98 for indicating the average length of data subjected to read and write requests; and area 99 for using the file node as a cache. The number of read requests 96, the number of write requests 97 and the access data length 98 are reset by the "multiplex" program 47 at intervals of a predetermined time. At the time of generating of a mirror file, the access data length 98 is used for judgment as to whether striping is to be performed or not to be performed.

Referring to FIG. 1 and FIGS. 7 through 14, the operation of the first embodiment will be described below.

Figure 7:
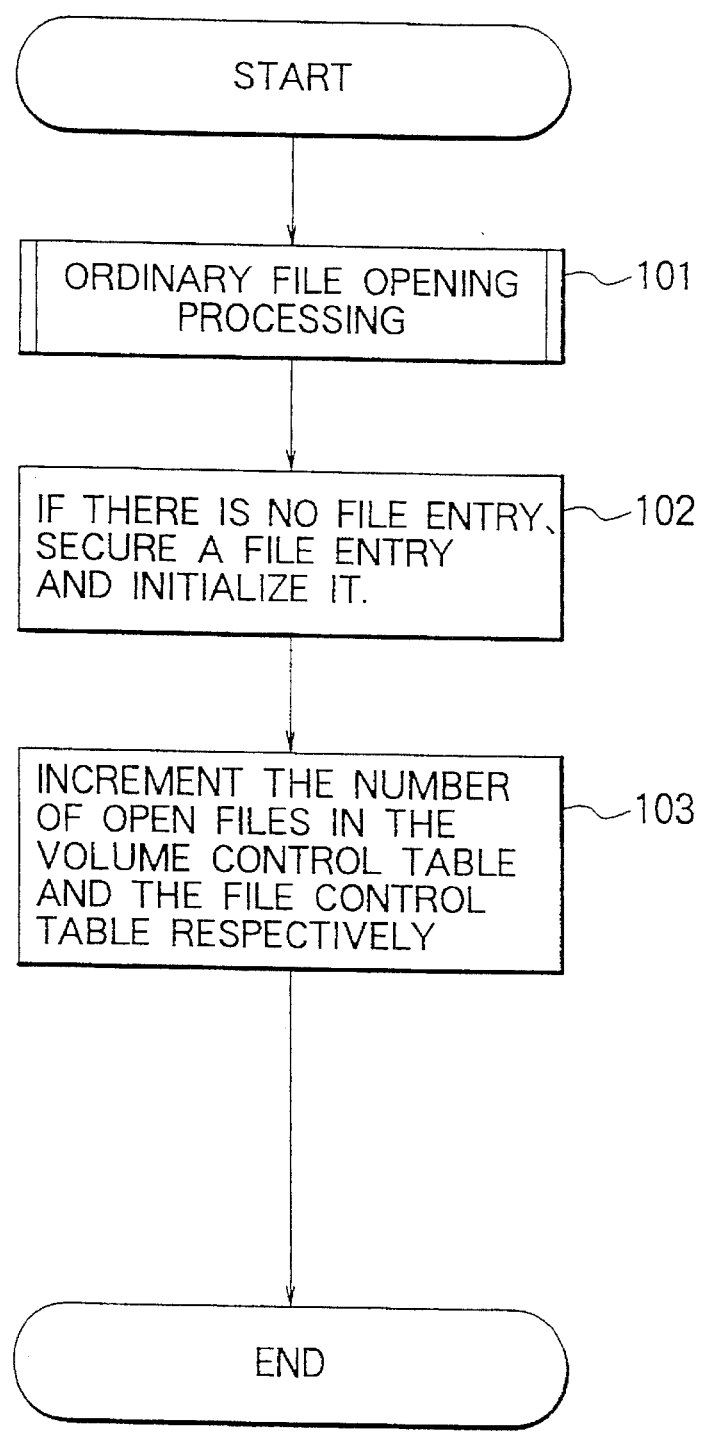
FIG. 7 is a flow chart of the "open" program in the first embodiment.

Referring now to FIG. 7, the operation of the "open" program 41 will be described. After ordinary file opening (step 101) is performed, file entries are retrieved from the file control table 32. If there is no file entry, a file entry is secured and initialized (step 102). Then, the number of open files 85 in the volume control table 31 and the number of open files 94 in the file control table 32 are increased by one respectively (step 103). In this manner, the number of files currently opened by volumes and the number of files currently opened by files are secured.

Figure 8:
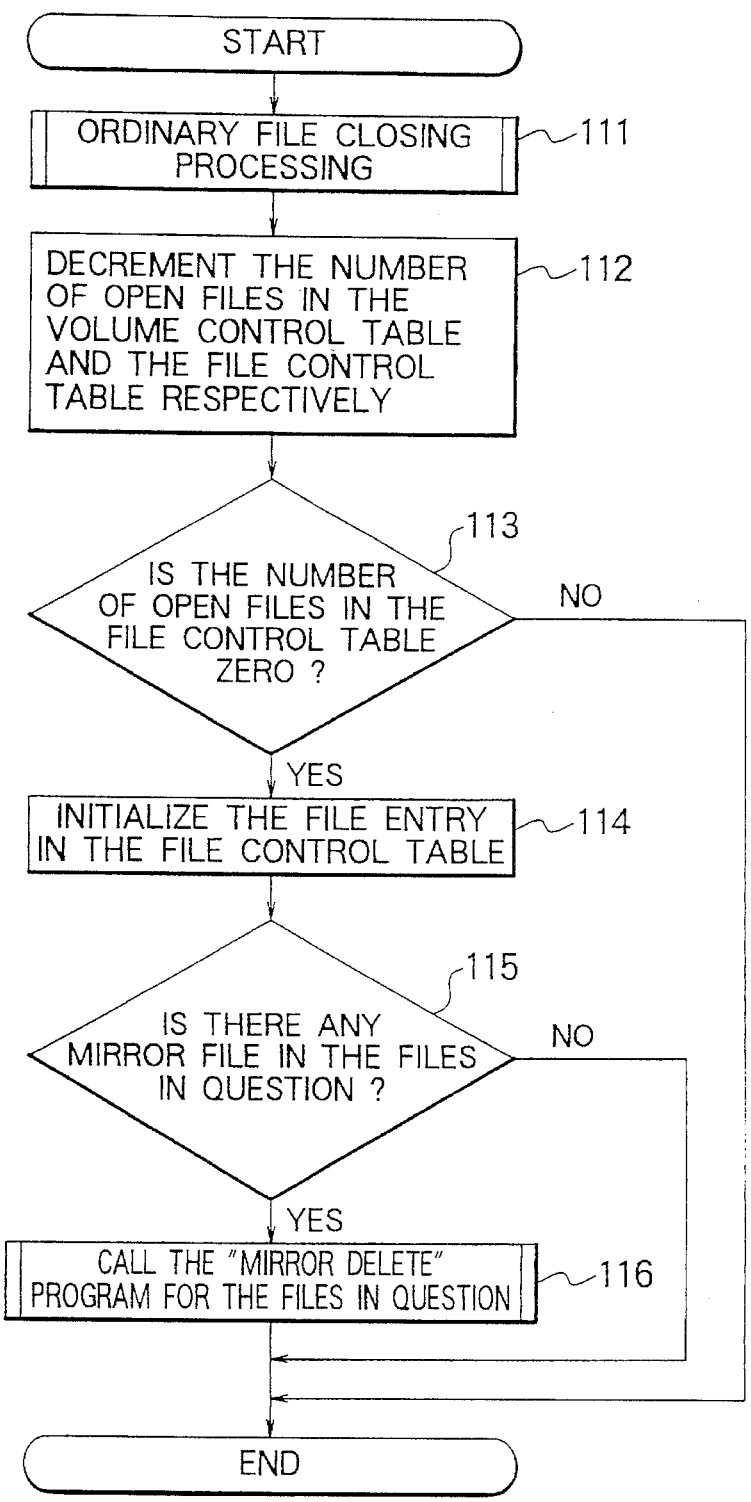
FIG. 8 is a flow chart of the "close" program in the first embodiment.

Referring to FIG. 8, the operation of the "close" program 42 will be described. After ordinary file closing (step 111) is performed, the number of open files 85 in the volume control table 31 and the number of open files 94 in the file control table 32 are decreased by one respectively (step 112). If the number of open files 94 is not zero (step 113), that is, if there is any application program 21 opened, this routine is terminated without deletion of any mirror file. If the number of open files 94 is zero (step 113), the file entry in the file control table 32 is initialized (step 114). If there is any mirror file for the target file, the "mirror delete" program 48 is called to delete the mirror file (steps 115 and 116). Specifically, the file node of the mirror file is retrieved from the list 74 of mirror nodes corresponding to file nodes to be closed, the mirror file of the retrieved file node is deleted and the file node of the deleted mirror file is removed from the chain of the mirror node list 74.

Figure 9:
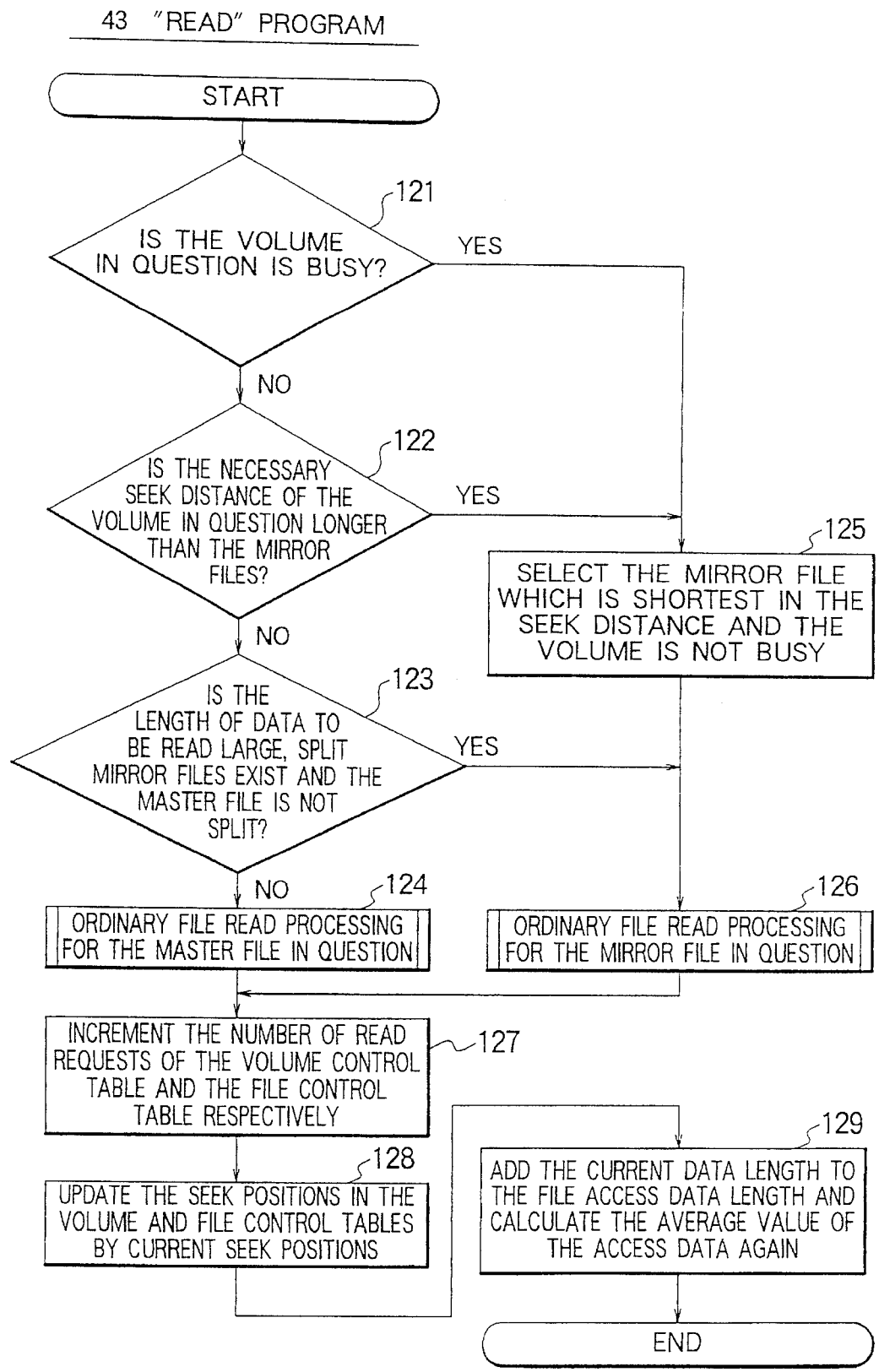
FIG. 9 is a flow chart of the "read" program in the first embodiment.

Referring to FIG. 9, the operation of the "read" program 43 will be described. In the case where the volume to be requested is busy or in the case where the seek time can be shortened when mirror files 35 and 36 are selected (steps 121 and 122), the mirror file shortest in the seek distance is selected (step 125) and a read request is issued for the selected mirror file (step 126). The reason why the mirror file is accessed when the volume to be request is busy is in that generation o#waiting time is avoided. In the case where the volume to be requested is not busy, the volume shortest in seek distance among the master and mirror files is selected to shorten the time of execution of I/O processing. In the case where the length of data subjected to a read request is so large that split mirror files 38 and 39 exist (steps 121 to 123), read requests are issued for the split mirror files (step 126). Because the effect of striping is large when the length of data subjected to a read request is large, data can be preferably read in parallel from the split mirror files 38 and 39 to shorten the time of execution of I/O processing.

In the case where any of the aforementioned conditions is not satisfied, a read request is issued for the master file 34 (step 124). Then, the number of read requests 87 in the volume control table 31 and the number of read requests 96 in the file control table 32 are increased by one respectively and the seek position 86 and the access data length 98 are updated in accordance with the current read request (steps 127 to 129). The access data length 98 is calculated as the average length of data accessed by the number of times counted by the number of read requests 96 and the number of write requests 97.

Figure 10:
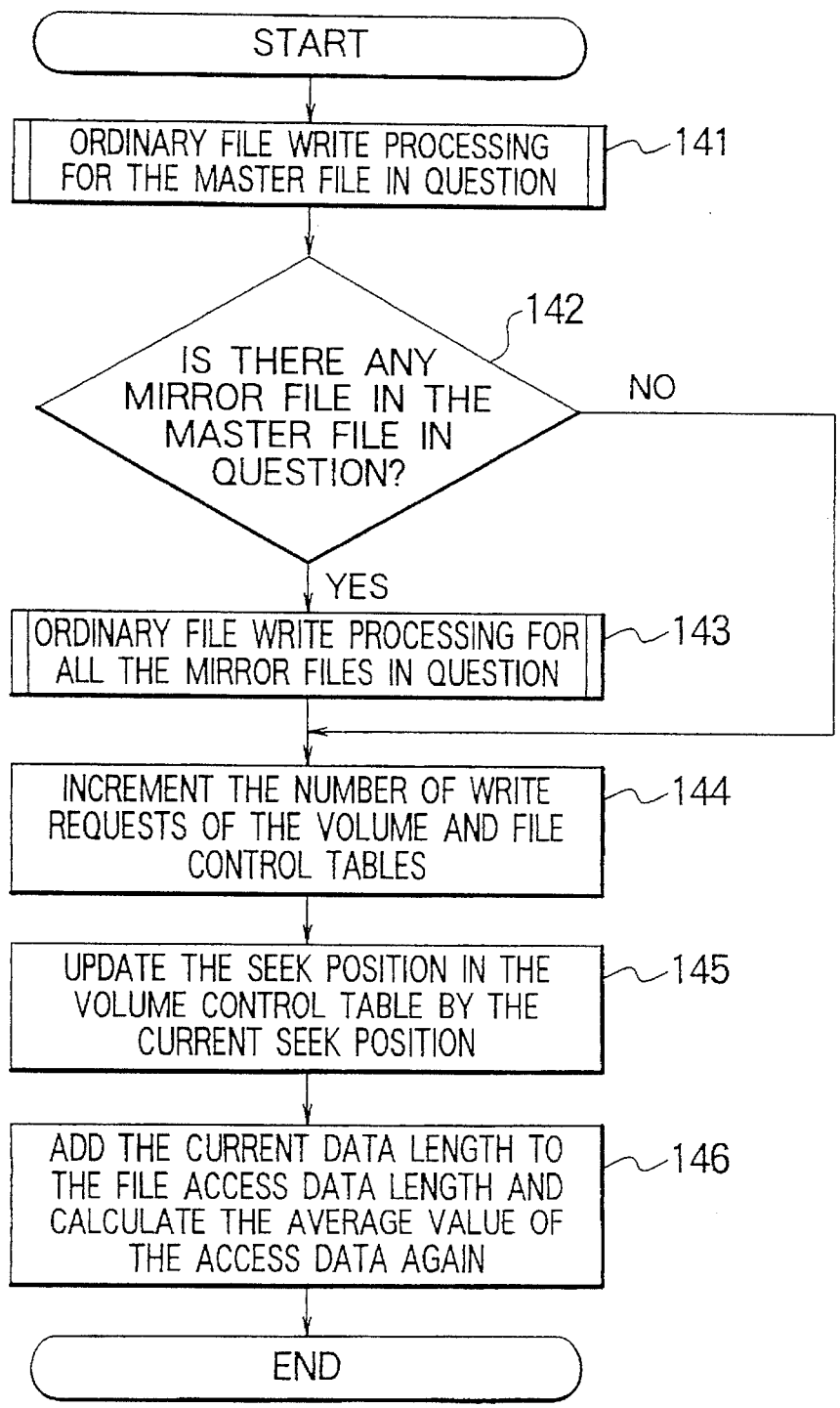
FIG. 10 is a flow chart of the "write" program in the first embodiment.

Referring to FIG. 10, the operation of the "write" program 44 will be described. After ordinary file writing (step 141) is subjected to the master file 34, ordinary file write requests are issued for all mirror files 35, 36, 38 and 39 existent as copies for mirroring the master file 34 (steps 142 to 143). Then, the number of write requests 88 in the volume control table 31 and the number of write requests 97 in the file control table 32 are increased by one respectively and the seek position 86 and the access data length 98 are updated in accordance with the current writing (steps 144 to 146). In this manner, data matching between the master file and the mirror files is maintained by performing writing for the all mirror files.

Figure 11:
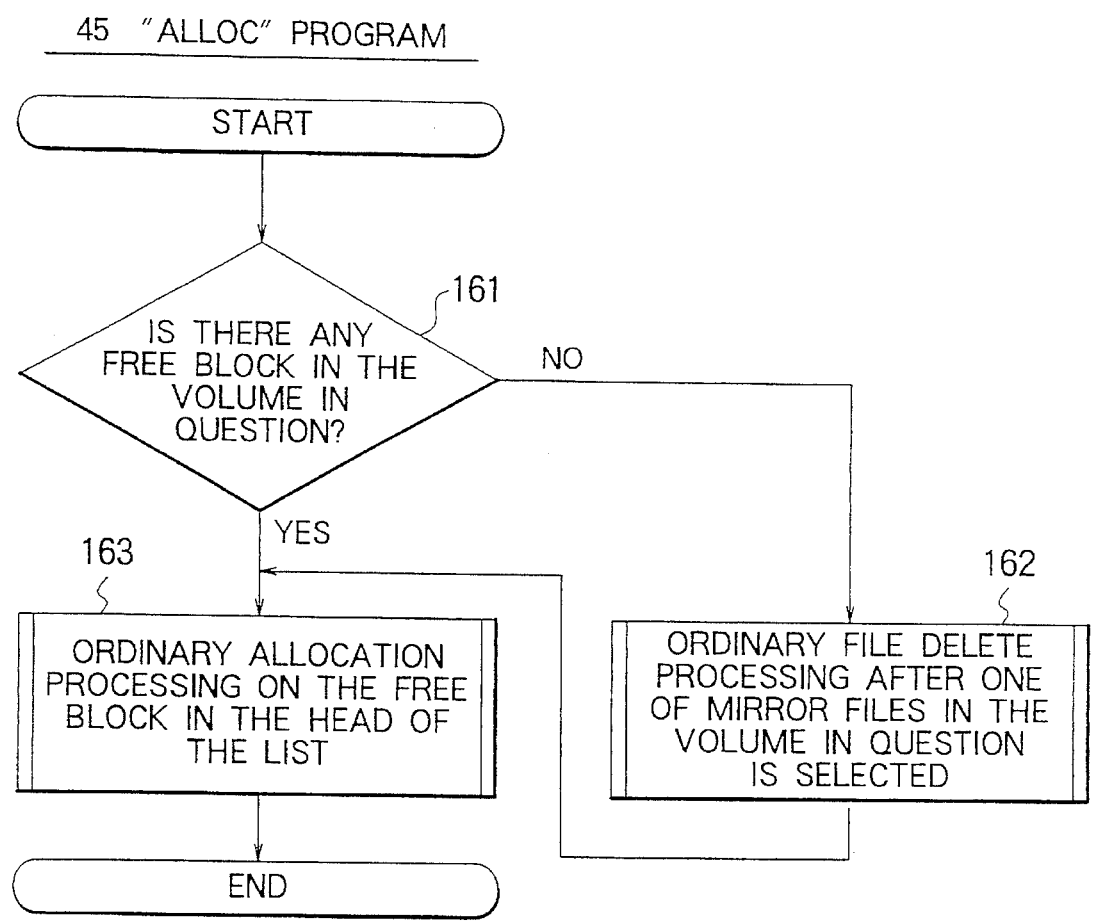
FIG. 11 is a flow chart of the "alloc" program in the first embodiment.

Referring to FIG. 11, the operation of the "alloc" program 45 will be described. The "alloc" program 45 is called when the file system 26 writes new data in a file, so that the "alloc" program 45 allocates a free block 64 of the data area 62 in the volume to the file. If there is no free block in the volume (step 161), one of mirror files in the volume is selected and deleted to thereby generate a free block (step 162). Then, the free block is removed from the chain of the free block list 56 in the volume management block 33 before ordinary allocating is performed (step 163). By performing allocating, the volume identifier 78 and the block address 79 in the address table 77 of the file node 61 are set. In this manner, each block in the data area 62 as allocated to a mirror file serves as a quasi-free area which can be used as a free area for a new block when there is no free area.

Figure 12:
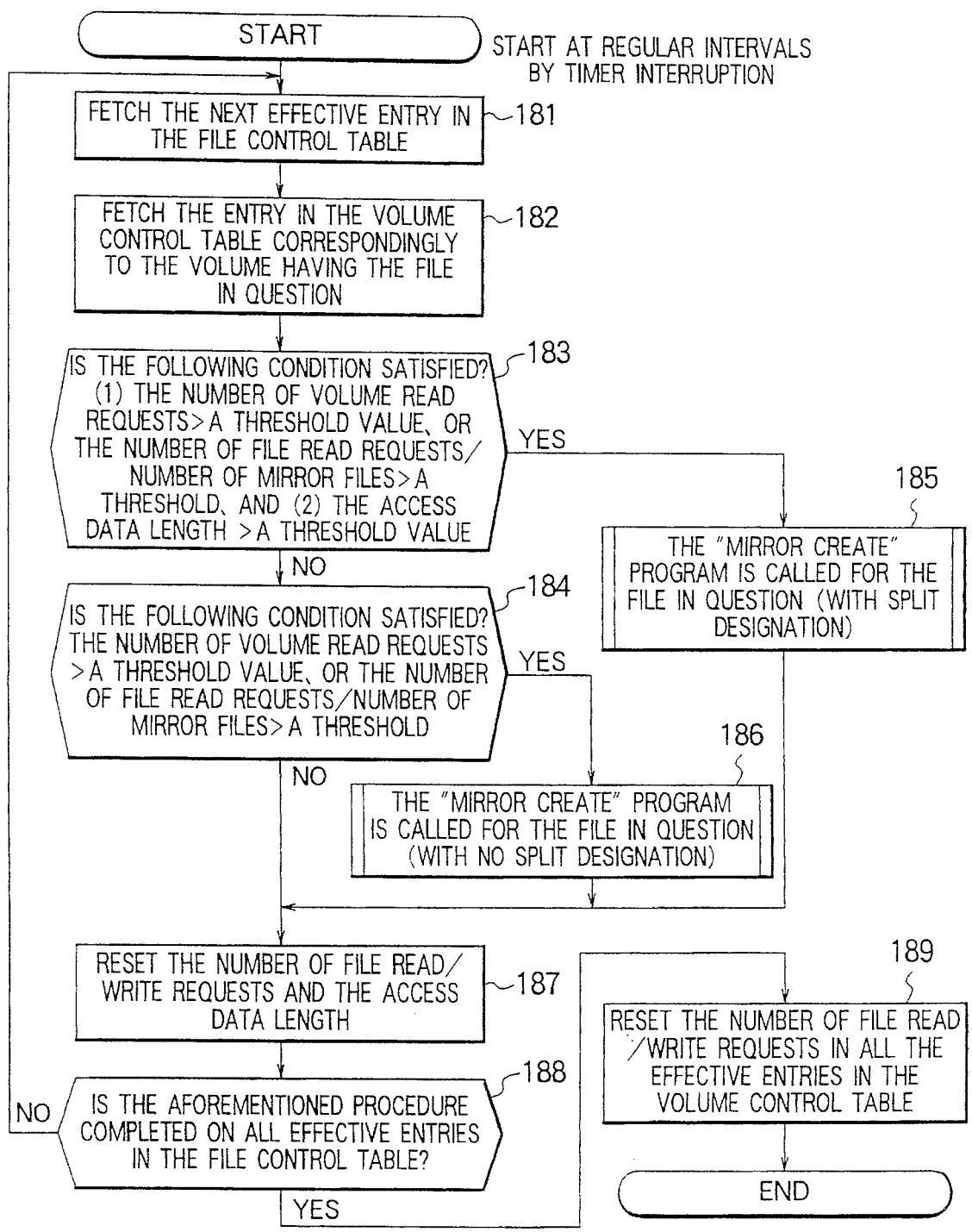
FIG. 12 is a flow chart of the "multiplex" program in the first embodiment.
Figure 13:
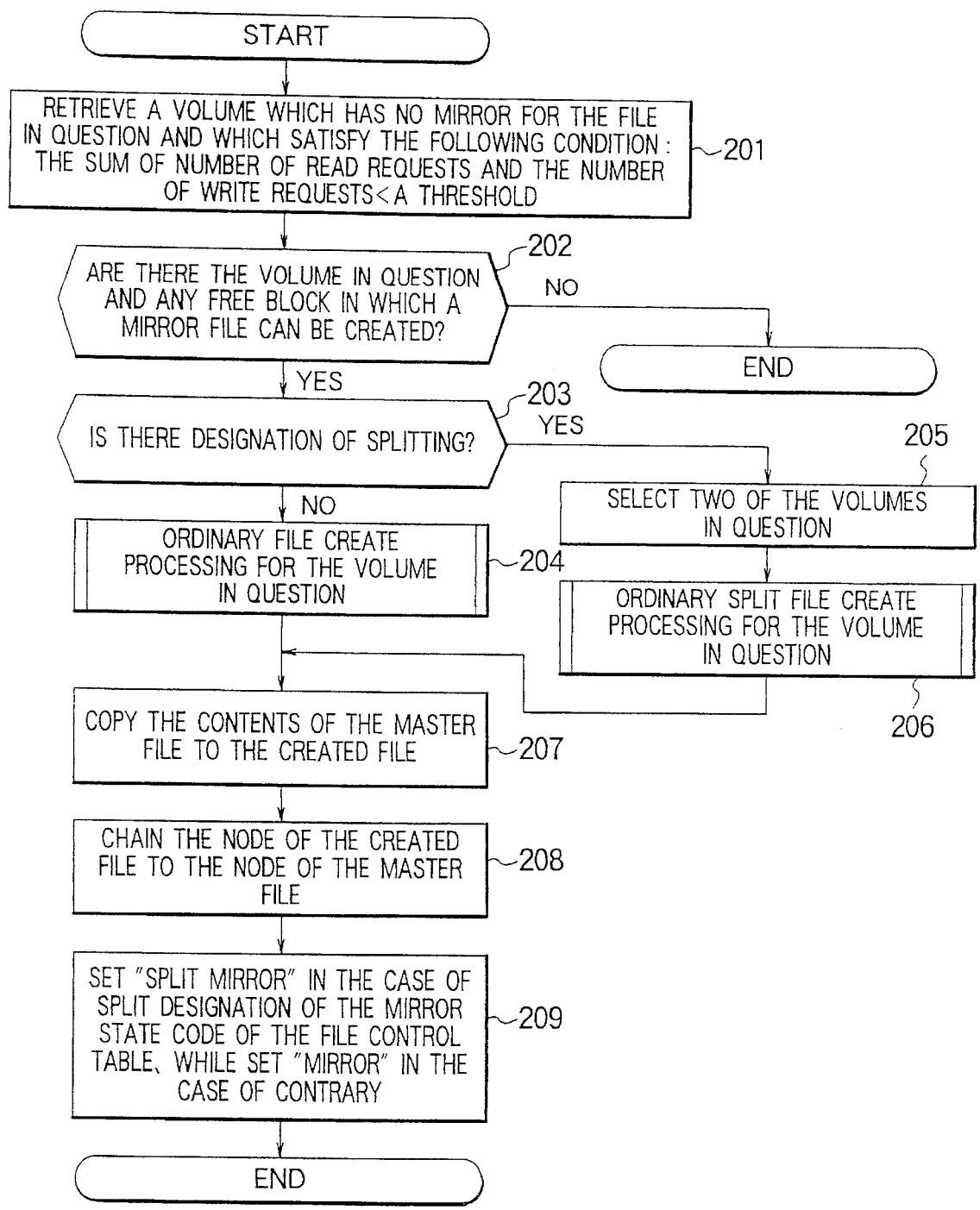
FIG. 13 is a flow chart of the "mirror create" program in the first embodiment.
Figure 14:
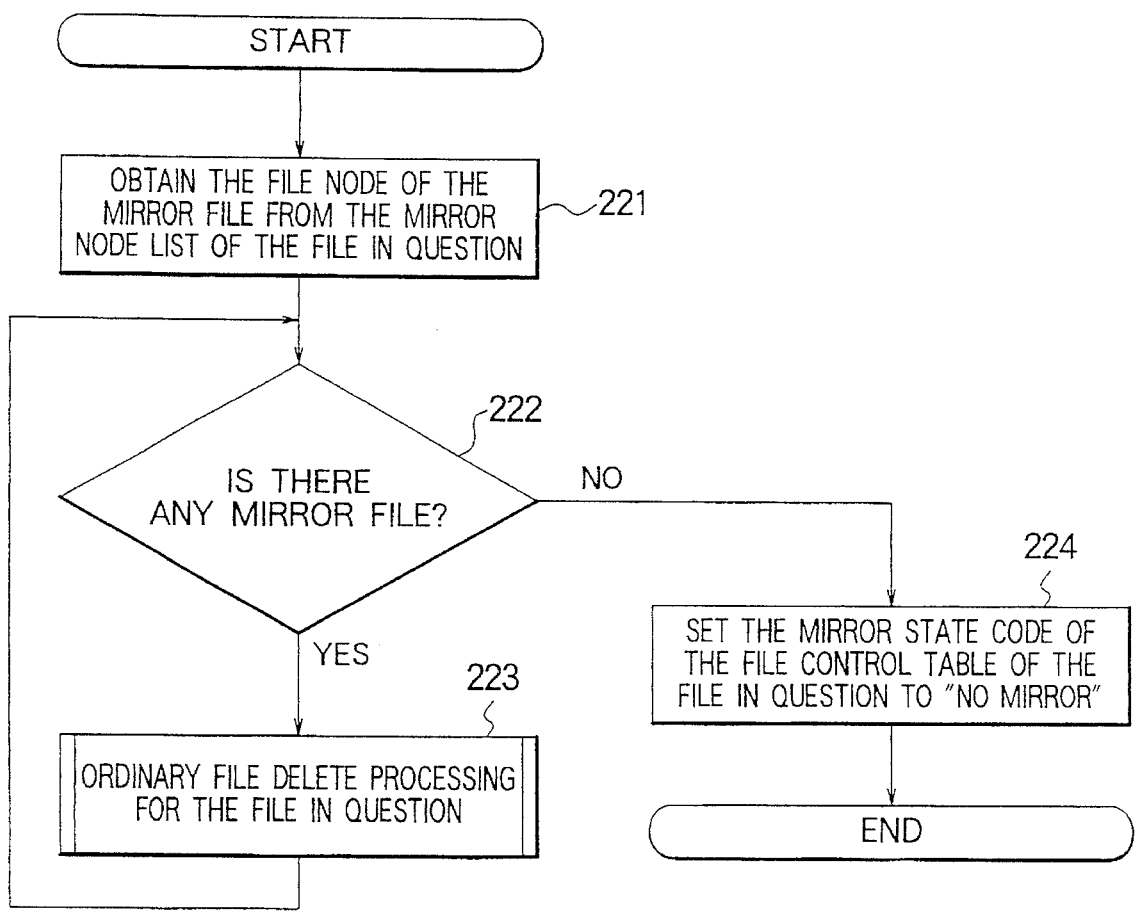
FIG. 14 is a flow chart of the "mirror delete" program in the first embodiment.

Referring to FIGS. 12 through 14, the operations of the programs 46, 47 and 48 newly provided for the file system 26 in the present invention will be described below. Referring now to FIG. 12, the operation of the "multiplex" program 46 will be described. The "multiplex" program 46 is operated by timer interruption at intervals of a predetermined time. All effective entries in the file control table 32, that is, all open files are subjected to the following steps. The next effective entry is fetched and an entry in the volume control table 31 is fetched correspondingly to the volume having the file stored in the entry (steps 181 and 182). In the case where a value obtained by dividing the number of volume read requests 87 (or file read requests 96) by the number of mirror files is larger than a threshold and the access data length 98 of the file is larger than a threshold (step 183), the "mirror create" program 47 is called with splitting of the file on the basis of the judgment that striping (split mirror files 38 and 39) is valid (step 185).

In the case where the value obtained by dividing the number of volume read requests 87 (or file read requests 96)

by the number of mirror files is larger than the threshold (step 184), the "mirror create" program 47 is called without splitting of the file on the basis of the judgment that the mirror files 35 and 36 are valid (step 186). In the case where any of the aforementioned conditions is not satisfied, neither mirror file nor split mirror file is created. Then, the number of file read requests 96, the number of file write requests 97 and the access data length 98 are reset (step 187). When the aforementioned procedure is completed on all effective entries in the file control table 32 (step 188), the number of read requests 87 and the number of write requests 88 in each of the all effective entries in the volume control table 31 are reset (step 189). The aforementioned data are reset whenever this program 46 is started, so that not only the number of read requests 87 and the number of read requests 96 can indicate recent read frequency but the access data length 98 can indicate recent average access data length. Accordingly, data multiplexing can be performed in accordance with the dynamic change of load imposed on the system.

Referring to FIG. 13, the operation of the "mirror create" program 47 will be described. A volume having no mirror for the file and smaller in the sum of the number of read requests 87 and the number of write requests 88 in the volume control table 31 than a threshold is retrieved (step 201). If there is no volume satisfying the aforementioned condition, returning is made. In the case where there is any volume satisfying the aforementioned condition and there is any free block capable of creating a mirror file and in the case where splitting is designated (steps 202 and 203), two volumes satisfying the aforementioned condition are selected so that the two selected volumes are subjected to ordinary split file creating (steps 205 and 206). That is, split mirror files 38 and 39 are created. If there is no designation of splitting, the volume is subjected to ordinary file creating (step 204). That is, mirror files 35 and 36 are created. Data contained in the master file 34 is copied in the created files (step 207). The file nodes 61 of the generated mirror files are added to the chain in the master file mirror node list 76 (step 208). The mirror state code 95 of the master file is set to "split mirror" when splitting is designated and the mirror state code 95 is set to "mirror" when there is no designation of splitting (step 209).

Referring to FIG. 14, the operation of the "mirror delete" program 48 will be described. The file node of the mirror file is obtained from the mirror node list 76 of the given file (step 221). If there is any mirror file (step 222), the given file is subjected to ordinary file deleting (step 223) and then the situation of the routine goes back to the step 222. If there is no mirror file, the mirror state code 95 is set to "no mirror" (step 224).

Figure 15:
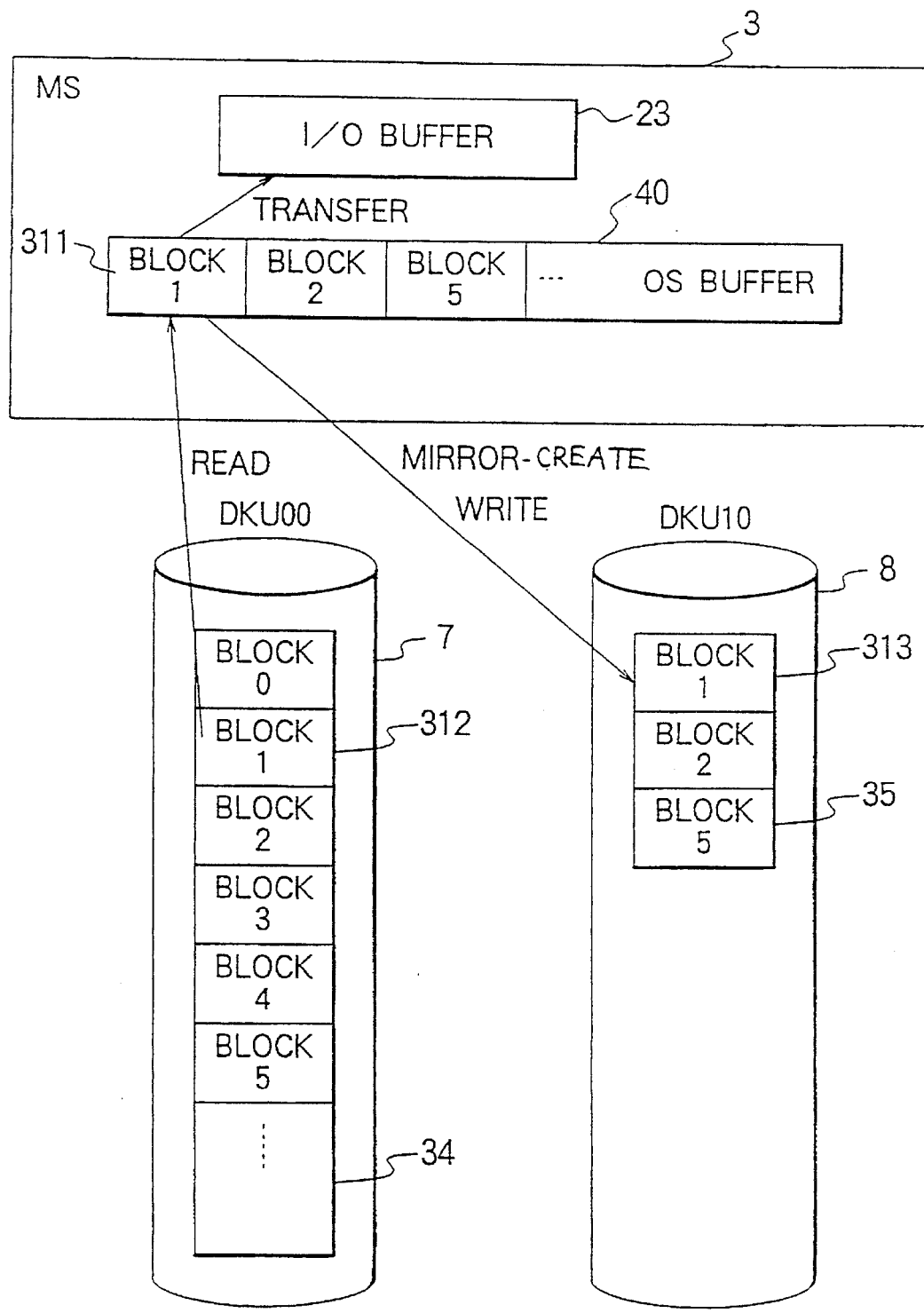
FIG. 15 is a structural diagram of data in a second embodiment of the present invention.
Figure 16:
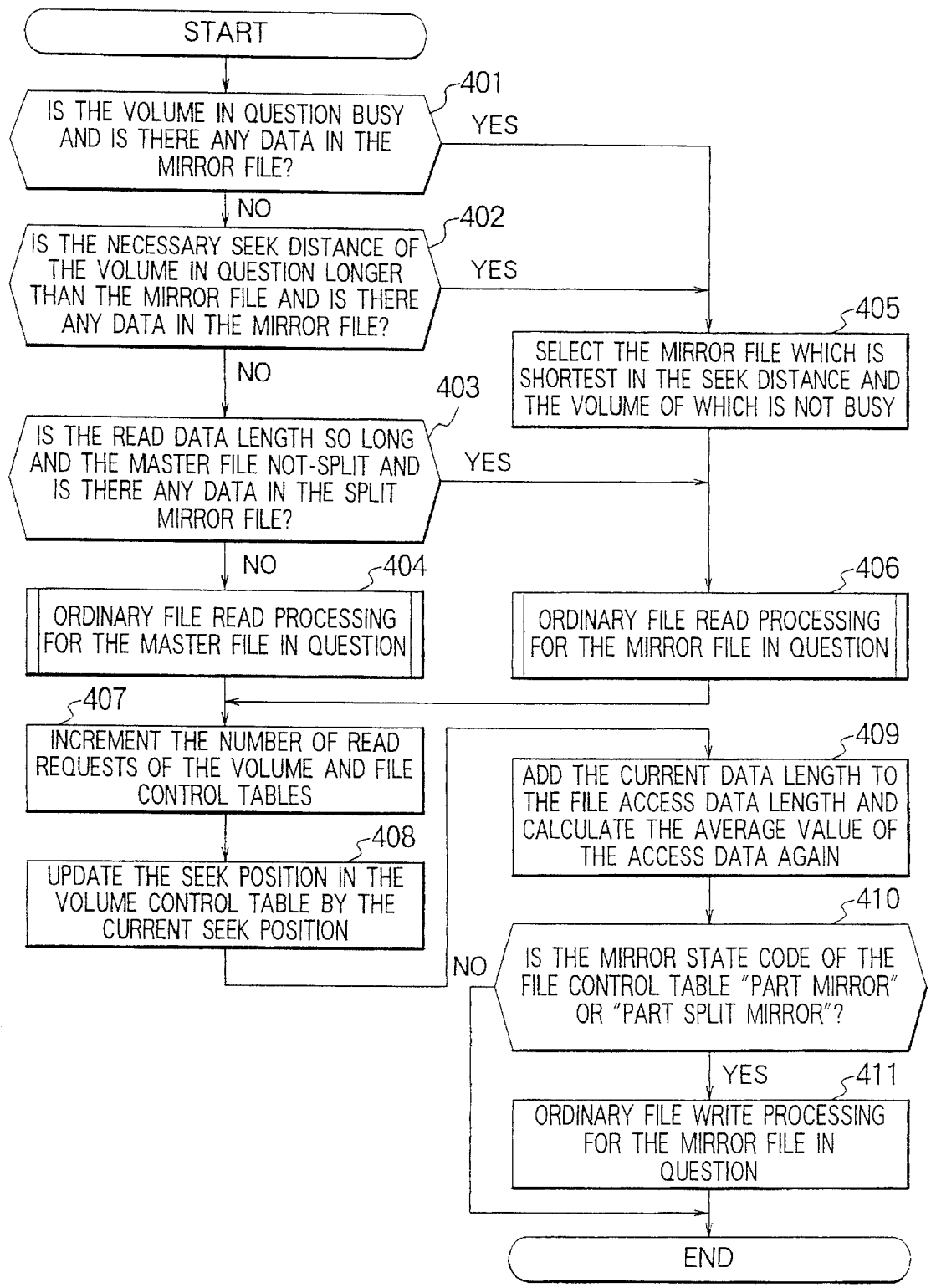
FIG. 16 is a flow chart of the "read" program in the second embodiment.
Figure 17:
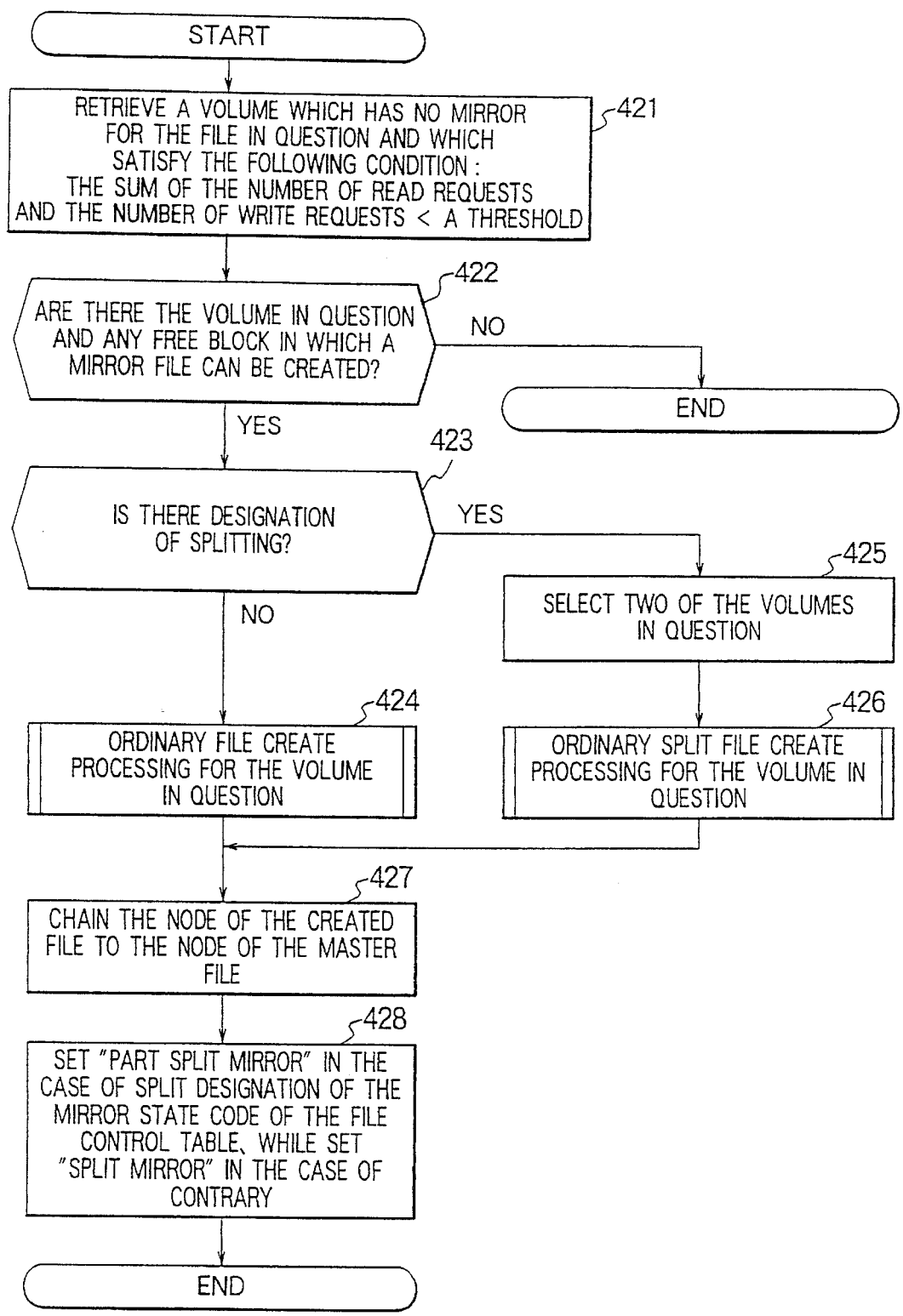
FIG. 17 is a flow chart of the "mirror create" program in the second embodiment.

Referring to FIGS. 15 through 17, a second embodiment of the present invention obtained by partly modifying the first embodiment will be described below. FIG. 15 is a structural diagram of data in this embodiment. In the first embodiment, data are copied from the master file 34 at the time of generating of mirror files 35 and 36 and split mirror files 38 and 39. That is, in the first embodiment, data are block-by-block read from the master file 34 into the OS buffer 40 of the main storage 3 and written in mirror files. On the contrary, in this embodiment, blocks 311 read into the OS buffer 40 at the time of processing of read requests are written in a mirror file 35 in order to lighten copy overhead. Accordingly, the mirror file 35 holds not whole but part data of the master file 34. If read access is local, performance can be improved sufficiently even in the case where the mirror file contains part data of the master file. Further, overhead required for copying in the second embodiment is smaller than that in the first embodiment because the overhead in the second embodiment occurs only at the time of writing of data from the OS buffer 40. In this embodiment, only the "read" program 43 and the "mirror create" program 47 provided in the first embodiment are changed.

Referring to FIG. 16, the operation of the "read" program 43 will be described. In the case where the volume to be requested is busy and there is any target block in mirror files or in the case where the seek time can be shortened when mirror files 35 and 36 are selected and there is any target block in the mirror files (steps 401 and 402), the mirror file shortest in the seek distance is selected (step 405) and a read request is issued for the selected mirror file (step 406). The reason why the mirror file is accessed when the volume to be request is busy is in that generation of waiting time is avoided.

In the case where the volume to be requested is not busy, the volume shortest in seek time among the master and mirror files is selected to shorten the time of execution of I/O processing. In the case where the length of data subjected to a read request is so large that target blocks exist in split mirror files 38 and 39 (steps 401 to 403), read requests are issued for the split mirror files (step 406). Because the effect of striping is large when the length of data subjected to a read request is large, data can be preferably read in parallel from the split mirror files 38 and 39 to shorten the time of execution of I/O processing. In the case where any of the aforementioned conditions is not satisfied, a read request is issued for the master file 34 (step 404). Then, the number of read requests 87 in the volume control table 31 and the number of read requests 96 in the file control table 32 are increased by one respectively and the seek position 86 and the access data length 98 are updated in accordance with the current read request (steps 407 to 409). In the case where the mirror state code of the file indicates "part mirror" or "part split mirror" (step 410), the block 311 which has been read from the master file in the step 404 and currently exists in the OS buffer 40 is written in the mirror file (step 411).

Referring to FIG. 17, the operation of the "mirror create" program 47 will be described. A volume having no mirror for the file and smaller in the sum of the number of read requests 87 and the number of write requests 88 in the volume control table 31 than a threshold is retrieved (step 421). If there is no volume satisfying the aforementioned condition, returning is made. In the case where there is any volume satisfying the aforementioned condition and there is any free block capable of generating a mirror file and in the case where splitting is designated (steps 422 and 423), two volumes satisfying the aforementioned condition are selected so that the two selected volumes are subjected to ordinary split file generating (steps 425 and 426). That is, split mirror files 38 and 39 are generated. If there is no designation of splitting, the volume is subjected to ordinary file generating (step 424). That is, mirror files 35 and 36 are generated. The file nodes 61 of the generated mirror files are added to the chain in the master file mirror node list 76 (step 427). The mirror state code 95 of the master file is set to "part split mirror" when splitting is designated and the mirror state code 95 is set to "part mirror" when there is no designation of splitting (step 428). A third embodiment of the present invention will be described below. The third embodiment has the substantial same structure as that of the first embodiment and makes the substantially same operation as that of the first embodiment, except that the third embodiment is different from the first embodiment in timing of multiplexing data. In the first embodiment, a program operated at intervals of a predetermined time acts to multiplex data in accordance with the condition of use of files or file storage devices. On the contrary, in the third embodiment, data are multiplexed, that is, mirror files are created when a file is opened.

Figure 18:
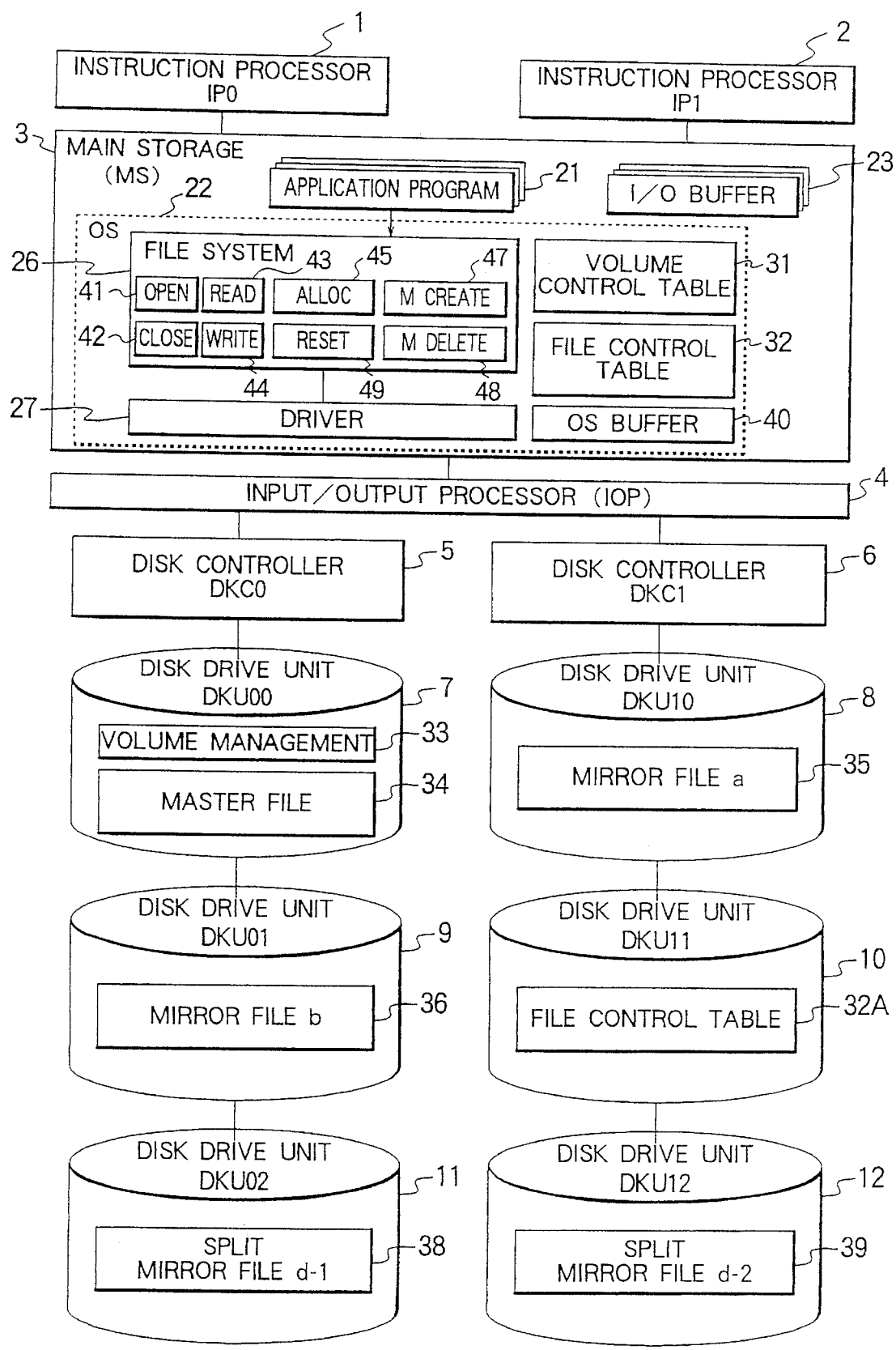
FIG. 18 is a block diagram showing the structure of a data processing system according to a third embodiment of the present invention.

Referring to FIG. 18, the structure of the third embodiment will be described. As shown in Fig. 18, the structure of the third embodiment is substantially equal to that of the first embodiment, except that in the third embodiment, the "multiplex" program 46 is removed, a "reset" program 49 is provided, and a file control table 32A is stored in a disk drive unit DKU11. The file control table 32A is a table in which files to be multiplexed are registered when the files are opened. The file control table 32A is stored in the disk drive unit DKU11 when the system is suspended, and the table 32 is read into the main storage 3 when the system starts.

The operation of the third embodiment is different from that of the first embodiment only in the "open" program 41 and the "reset" program 49. Further, a system manager's operation by which files to be multiplexed at the time of opening of the files are registered in the file control tables 32 and 32A and a system manager's operation by which the files are deleted from the file control tables 32 and 32A are provided in the third embodiment. The registration and deletion are performed through the system manager's procedure of inputting file designating commands from a console terminal. Because this procedure is not special, the flow of the procedure will be omitted.

Figure 19:
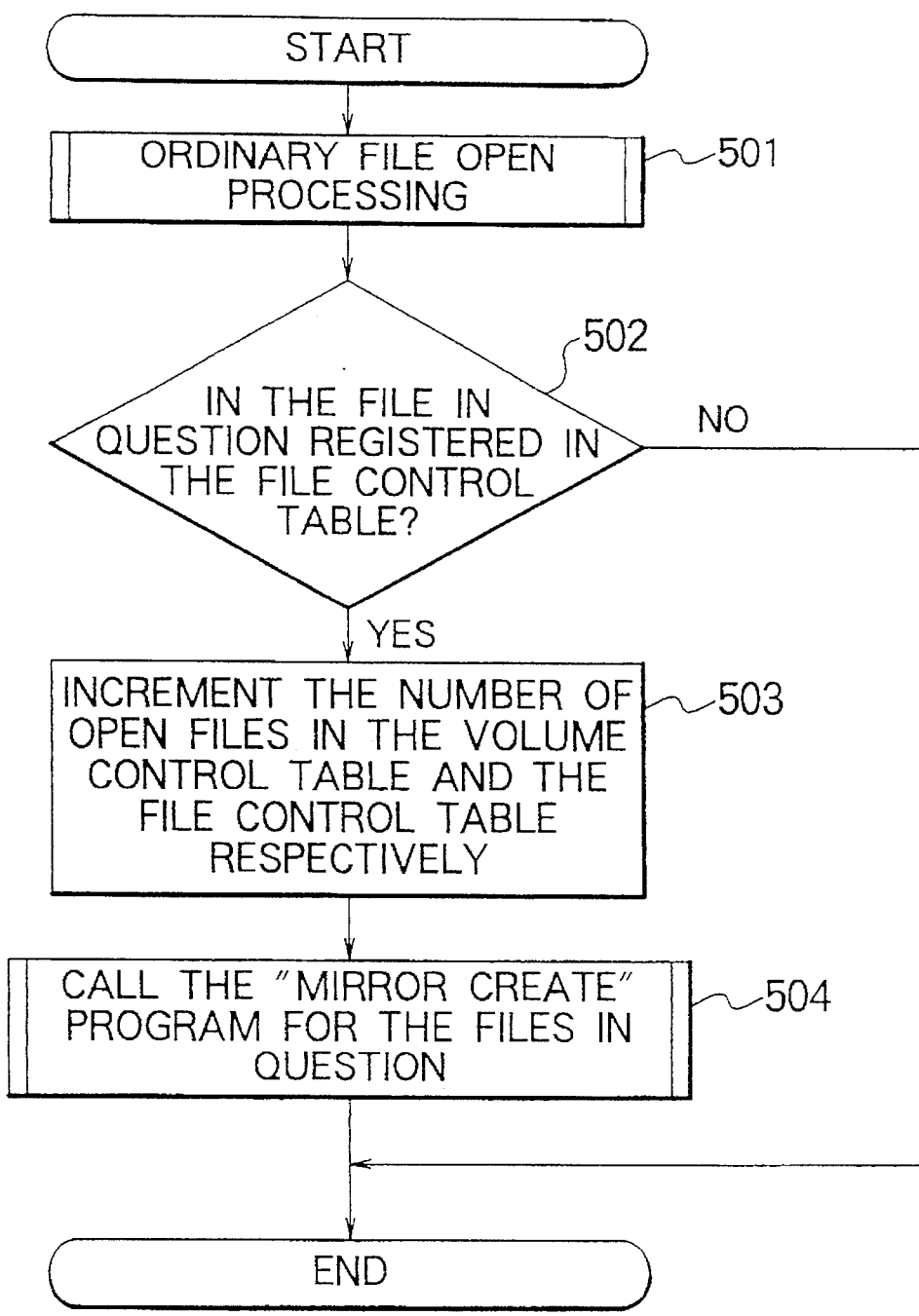
FIG. 19 is a flow chart of the "open" program in the third embodiment.

Referring now to FIG. 19, the operation of the "open" program 41 will be described. If a given file is registered in the file control table 32 (step 502) after ordinary file opening (step 501) is performed, the number of open files 85 in the volume control table 31 and the number of open files 94 in the file control table 32 are increased by one respectively (step 503). In this manner, the number of files currently opened by volumes and the number of files currently opened by files are secured. Then, the "mirror generate" program 47 is called for the given file (step 504).

Figure 20:
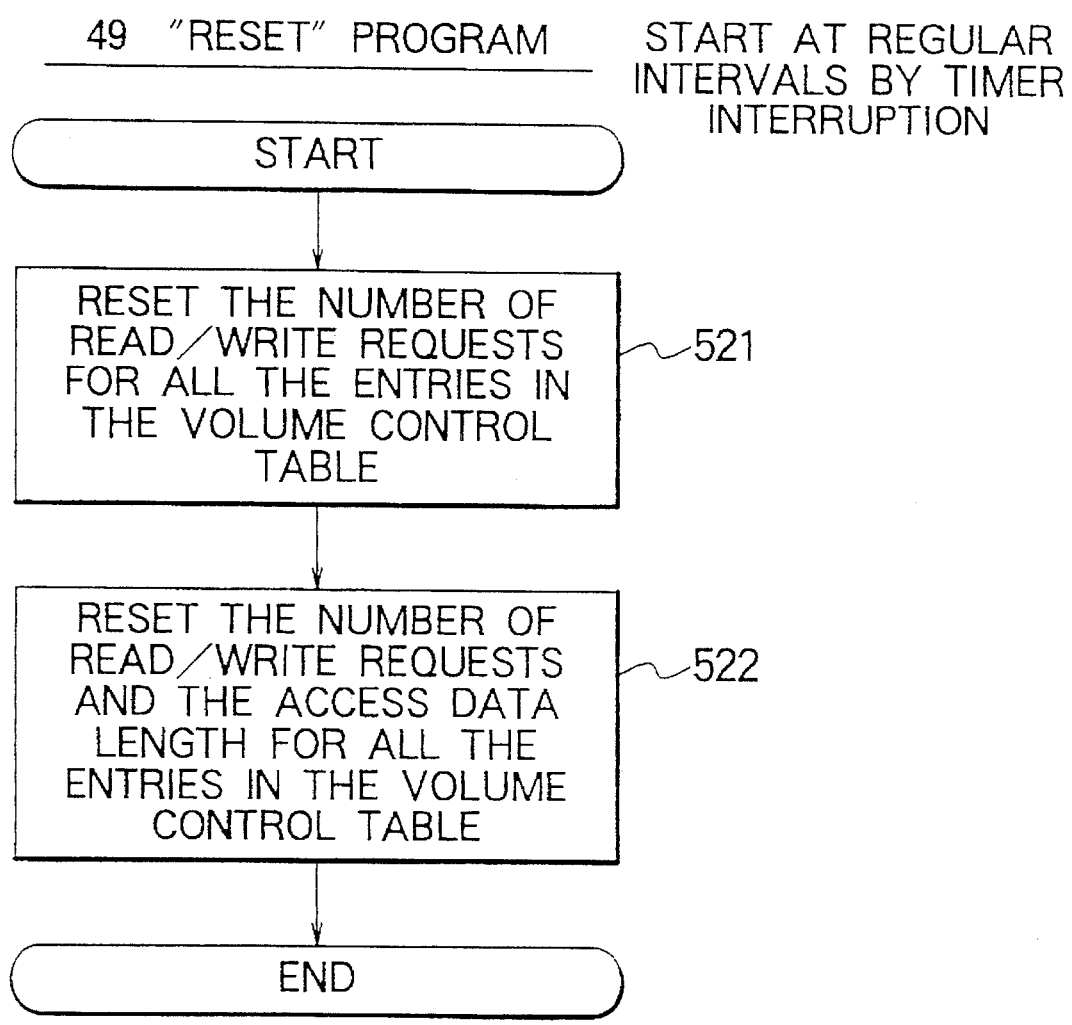
FIG. 20 is a flow chart of the "reset" program in the third embodiment.

Referring to FIG. 20, the operation of the "reset" program 49 will be described. This program is operated by timer interruption at intervals of a predetermined time. The number of read requests 87 and the number of write requests 88 in each of all effective entries in the volume control table 31 are reset (step 521) and the number of read requests 96, the number of write requests 97 and the access data length 98 in each of all effective entries in the file control table 32 are reset (step 522). That is, the aforementioned data are reset whenever this program starts, so that not only the number of read requests 87 and the number of read requests 96 can indicate recent read frequency but the access data length 98 can indicate recent average access data length. Accordingly, data multiplexing can be performed in accordance with the dynamic change of load imposed on the system.

A fourth embodiment of the present invention will be described below. This embodiment is adapted to the case where the procedure of the third embodiment is carried out not by an OS but by a "library" program located between an OS and an application program. This embodiment shows that the method according to the present invention is not always carried out by an OS.

Figure 21:
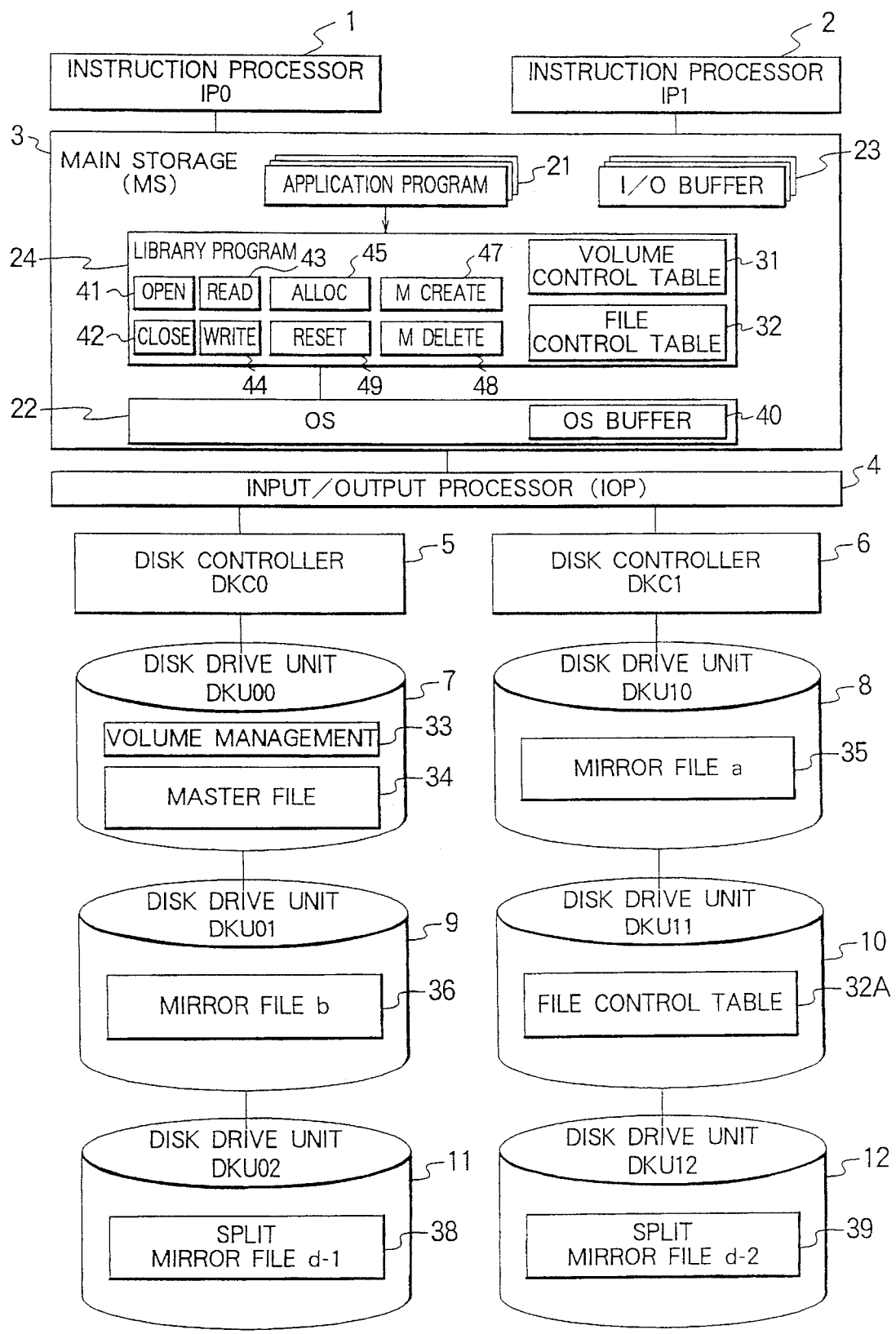
FIG. 21 is a block diagram showing the structure of a data processing system according to a fourth embodiment of the present invention.

Referring to FIG. 21, the structure of the fourth embodiment will be described. As shown in FIG. 21, the fourth embodiment shows the case where processing programs and tables necessary for the present invention are contained in a "library" program 24 though the first embodiment shows the case where these necessary programs and tables are contained in an OS. The "library" program 24 processes a file system by using conventional system calling functions of an OS 22. The operation of the fourth embodiment is equal to that of the third embodiment, except that the procedures of calling "open", "close", "read" and "write" of an ordinary file are replaced by the procedures of calling "open", "close", "read" and "write" of all files in the OS.

According to the present invention, data in the whole or part area of open files are multiplexed so as to be distributed into a plurality of file storage devices. Accordingly, data can be read successively from a file area shortest in seek time if a plurality of file areas can be accessed at the time of reading of data, so that I/O time can be shortened. Further, reading operations can be carried out in parallel in accordance with the number of distributed file storage devices, so that I/O throughput can be improved.

In the case where the number of access requests for data of small data length is large, the access requests are executed in different file storage devices individually, so that a larger number of access requests can be processed. In the case of access requests for data of large data length, one access request is executed in a plurality of file storage devices in parallel, so that access requests for data of large data length can be processed speedily.

Further, because data multiplexing is performed while files are opened, the multiplicity of data in accordance with I/O characteristic of a program to be opened and the number of file storage devices to be arranged can be selected so that I/O performance can be improved. When, for example, only "read" is issued, the data multiplicity n can be set to a large value to distribute data into n file storage devices so that I/O throughput of "read" can be increased by n times.

Further, in the case where the data length d of "read" is large, file data can be striped into m file storage devices so as to be divided into blocks each having a length of d/m, so that I/O time of "read" can be shortened to 1/m. Accordingly, a high-performance file system can be provided.

On the other hand, not only data multiplexing is performed while files are opened but the multiplex data are deleted at the time of closing of the files. Accordingly, the storage capacity required for data multiplexing can be selected in accordance with the number of files to be opened simultaneously, so that the file storage capacity of the system can be reduced.

Further, files used are partly multiplexed but the multiplexed part of files is recently updated part. Accordingly, in a system in which files are backed up periodically, reliability substantially equivalent to the reliability of conventional mirroring can be provided by a smaller redundant data storage capacity.

We claim:

1. A file access control method in a computer system which includes a processor and a plurality of drive units for holding files in rotating disk-type medium, wherein an operating system running on said processor provides an access request to said drive units in response to an access request given by one of plural application programs running on said processor; comprising steps executed by said operating system, the steps including:

monitoring accesses executed during each of predetermined time intervals to ones of files held in said drive units, said ones of said files being opened files for each of which a file open request has been provided by one of the application programs;

selecting at least one of said opened files, based upon said accesses monitored for one of said time intervals, as a file at least part of which is to be duplicated;

storing duplicated data of at least part of said selected one opened file at another one of said drive units;

reading out first data belonging to said part of said one opened file from either one of said one drive unit and said another drive unit, in response to a file read request provided by one of application programs for said first data after the storing of said duplicated data; and writing second data which should belong to said part of said one file into both of said one drive unit and said another drive unit, in response to a file write request provided by said application program for said second data after the storing of said duplicated data.

2. A method according to claim 1, further comprising:

deleting said duplicated data of said part of said one opened file held in said another drive unit, in response to a file close request provided for said one file by said one application program.

3. A method according to claim 1, wherein said selecting step includes the steps of:

detecting whether the accesses executed to said opened files as monitored for each interval satisfies a predetermined condition which allows one of said opened files to be duplicated;

selecting one of said opened files, in response to detecting that said accesses executed to said opened files, as monitored for one of said time intervals, satisfies the predetermined condition with respect to said one of said opened files.

4. A method according to claim 3, wherein said predetermined condition includes a first condition on a frequency of accesses to each opened file during one of the time intervals.

5. A method according to claim 4, wherein said first condition is that the frequency of accesses made to each opened file during one of the time intervals exceeds a predetermined threshold value.

6. A method according to claim 4, wherein said frequency of accesses includes a frequency of accesses for data read and does not include a frequency of accesses for data write.

7. A method according to claim 6, wherein said first condition is that the frequency of accesses made to said one opened file for data read during one of the time intervals exceeds a predetermined threshold value.

8. A method according to claim 4, wherein said predetermined condition further includes a second condition on average length of data accessed by accesses executed either for data read or data write during one of said time intervals to each opened file.

9. A method according to claim 8, wherein said second condition is that the average length of data accessed by said accesses exceeds a predetermined threshold.

10. A method according to claim 1, wherein the storing step includes storing whole data of one opened file into said another drive unit.

11. A method according to claim 1, wherein the storing step includes storing a number of parts of said one opened file respectively into plural ones of said drive units other than said one drive unit.

12. A method according to claim 1, further comprising the steps of:

monitoring a total amount of free area within each of the drive units;

detecting, in response to an allocation request of a new file provided by one of said application programs, whether there is in one of said drive units a free space large enough to be allocated to said new file, based upon the total amount of free space monitored for said one drive unit; and deleting one duplicated data stored in said one drive unit by said storing step, so as to make an area occupied by said duplicated area be a free space, if it has been detected that there is no such large free space in said one drive unit.

13. A method according to claim 1, further comprising:

monitoring a total number of files already opened among files held in each drive unit;

comparing drive units other than said one drive unit with each other, regarding the monitored number of files already opened, among files held in each of said other drive unit; and selecting, based upon a result of the comparing, one of said other drive units which holds a less number of files already opened than others of said other drive units, as said another drive unit.

14. A file access control method in a computer system which includes a processor and a plurality of drive units for holding files in rotating disk-type medium, wherein an operating system running on said processor provides an access request to said drive units in response to an access request given by one of plural application programs running on said processor; comprising steps executed by said operating system, the steps including:

selecting, as a file at least part of which is to be duplicated, at least one of opened files among said files held in said drive units, said opened files being files for each of which a file open request has been provided by one of the application programs;

monitoring a total number of opened files among files held in each drive unit;

comparing drive units other than one drive unit which holds said selected opened file with each other, regarding the monitored number of already opened files, among files held in each of said other drive unit;

selecting, based upon a result of the comparing, one of said other drive units which holds a less number of files already opened than others of said other drive units, as said another drive unit;

storing duplicated data of at least part of said selected one opened file at another one of said drive units;

reading out first data belonging to said part of said one opened file from either one of said one drive unit and said another drive unit, in response to a file read request provided by one of application programs for said first data after the storing of said duplicated data; and writing second data which should belong to said part of said one file into both of said one drive unit and said another drive unit, in response to a file write request provided by said application program for said second data after the storing of said duplicated data.

15. A method according to claim 14, further comprising:

monitoring accesses executed during each of predetermined time intervals to said opened files;

wherein said selecting of said one opened file is executed based upon a result of said monitoring executed at one of said intervals.

16. A file access control method in a computer system which includes a processor and a plurality of drive units for holding files in rotating disk-type medium, wherein an operating system running on said processor provides an access request to said drive units in response to an access request given by one of plural application programs running on said processor; comprising steps executed by said operating system, the steps including:

storing duplicated data of at least part of one of said files held in said drive units at another one of said drive units, in response to a file open request provided for said one file by one of said application programs to said operating system;

reading out first data belonging to said part of said one opened file from either one of said one drive unit and said another drive unit, in response to a file read request provided subsequently by said one application program for said first data;

writing second data which should belong to said part of said one opened file into both of said one drive unit and said another drive unit, in response to a file write request provided subsequently by said one application program for said second data; and deleting said duplicated data of said predetermined part of said one file held in said another drive unit, in response to a file close request provided for said one file by said one application program.

17. A method according to claim 16, wherein the storing step includes storing whole data of one file already opened into said another drive unit.

18. A method according to claim 16, wherein the storing step includes storing a number of parts of said one opened file respectively into plural ones of said drive units other than said one drive unit.

19. A method according to claim 16, further comprising:

monitoring a total number of files already opened among files held in each drive unit;

comparing drive units other than said one drive unit with each other, regarding the monitored number of files already opened, among files held in each of said other drive unit; and selecting, based upon a result of the comparing, one of said other drive units which holds a less number of files already opened than others of said other drive units, as said another drive unit.

20. A method according to claim 16, further comprising the steps of:

monitoring a total amount of free area within each of the drive units;

detecting, in response to an allocation request of a new file provided by one of said application programs, whether there is in one of said drive units a free space large enough to be allocated to said new file, based upon the total amount of free space monitored for said one drive unit; and deleting one duplicated data stored in said one drive unit by said storing step, so as to make an data occupied by said duplicated area be a free space, if it has been detected that there is no such a large free area in said one drive unit.

21. A file access control method in a computer system which includes a processor and a plurality of drive units for holding files in rotating disk-type medium, wherein an operating system running on said processor provides an access request to said drive units in response to an access request given by one of plural application programs running on said processor; comprising steps executed by said operating system, the steps including:

selecting, as a file at least part of which is to be duplicated, at least one opened file held in one of said drive units, said one opened file being selected from opened files among said files held in said drive units, said opened files being files for each of which a file open request has been provided by one of the application programs;

reading out data belonging to said one opened file from said one drive unit, in response to a file read request subsequently provided by said one application program for said data after the selecting;

transferring said read out data to a buffer area provided within a main storage provided in said computer system as read out data requested by said file read request;

transferring said transferred data from said buffer area into another of said drive units other than said one drive unit, as duplicated data of said part of said one opened file;

reading out first data belonging to said part of said one opened file from either one of said one drive unit and said another drive unit, in response to a file read request provided by one of application programs for said first data after the storing of said duplicated data; and writing second data which should belong to said part of said one file into both of said one drive unit and said another drive unit, in response to a file write request provided by said application program for said second data after the storing of said duplicated data.

22. A method according to claim 21, further comprising:

monitoring accesses executed during each of predetermined time intervals to said opened files;

wherein said selecting of said one opened file is executed based upon said accesses monitored for one of said time intervals.

23. A method according to claim 21, further comprising the steps of:

monitoring a total number of opened files among files held in each drive unit;

comparing drive units other than one drive unit which holds said selected opened file with each other, regarding the monitored number of files already opened files, among files held in each of said other drive unit; and selecting, based upon a result of the comparing, one of said other drive units which holds a less number of files already opened than others of said other drive units, as said another drive unit.

24. A method according to claim 21, further comprising:

deleting said duplicated data of said part of said one opened file held in said another drive unit, in response to a file close request provided for said one file by said one application program.

* * * * *